United States Patent
Yang et al.

(10) Patent No.: US 7,206,035 B2
(45) Date of Patent: Apr. 17, 2007

(54) METHOD OF FABRICATING LIQUID CRYSTAL DISPLAY DEVICE

(75) Inventors: Joon Young Yang, Kyonggi-do (KR); Yong In Park, Seoul (KR); Sang Hyun Kim, Kyonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 99 days.

(21) Appl. No.: 10/876,736

(22) Filed: Jun. 28, 2004

(65) Prior Publication Data

US 2005/0134754 A1  Jun. 23, 2005

(30) Foreign Application Priority Data

Dec. 22, 2003  (KR)  ............ 10-2003-0094975

(51) Int. Cl.
*G02F 1/136*  (2006.01)
(52) U.S. Cl. ...................................... 349/43
(58) Field of Classification Search ............ 349/42, 349/43, 187
See application file for complete search history.

(56) References Cited

U.S. PATENT DOCUMENTS

| | | | | |
|---|---|---|---|---|
| 5,943,107 A | * | 8/1999 | Kadota et al. ............. | 349/44 |
| 6,057,904 A | * | 5/2000 | Kim et al. ................ | 349/143 |
| 6,348,367 B1 | * | 2/2002 | Ohtani et al. ............. | 438/151 |
| 6,400,434 B1 | * | 6/2002 | Fukunaga .................. | 349/138 |
| 2004/0004692 A1 | * | 1/2004 | Hiroki ..................... | 349/192 |
| 2004/0124417 A1 | * | 7/2004 | So et al. .................. | 257/72 |
| 2004/0263703 A1 | * | 12/2004 | You ........................ | 349/42 |

* cited by examiner

*Primary Examiner*—James A. Dudek
(74) *Attorney, Agent, or Firm*—Morgan, Lewis & Bockius, LLP

(57) ABSTRACT

A method of fabricating a liquid crystal display device includes forming a first active layer on a substrate, forming a first gate insulating film on the first active layer, forming a first gate electrode on the first gate insulating film, forming a first interlayer insulating layer on the first gate electrode, forming a pixel electrode on the first interlayer insulating layer, forming at least one insulating film to cover the pixel electrode, forming a first plurality of contact holes in the first interlayer insulating layer and the at least one insulating film, the first plurality of contact holes including a first source contact hole to expose a first source area of the first active layer and a first drain contact hole to expose a first drain area of the first active layer, forming a pixel contact hole in the at least one insulating film to expose the pixel electrode, performing a hydrogenating treatment to the substrate including the first source contact hole, the first drain contact hole, and the pixel contact hole, and forming a first source electrode contacting the first source area of the first active layer, and a first drain electrode contacting the direct drain area of the first active layer and connected to the pixel electrode.

11 Claims, 33 Drawing Sheets

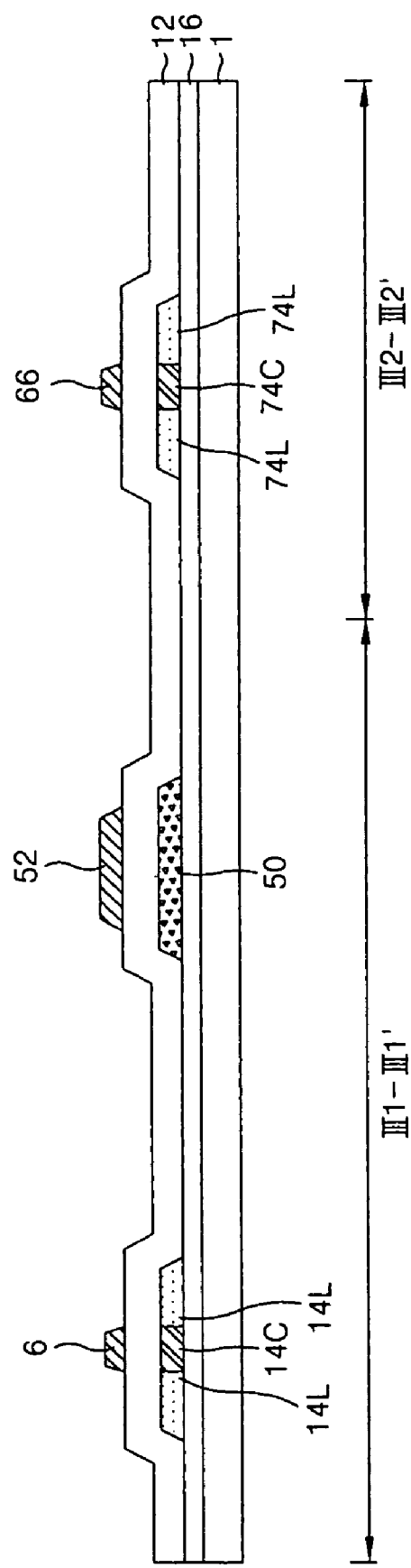

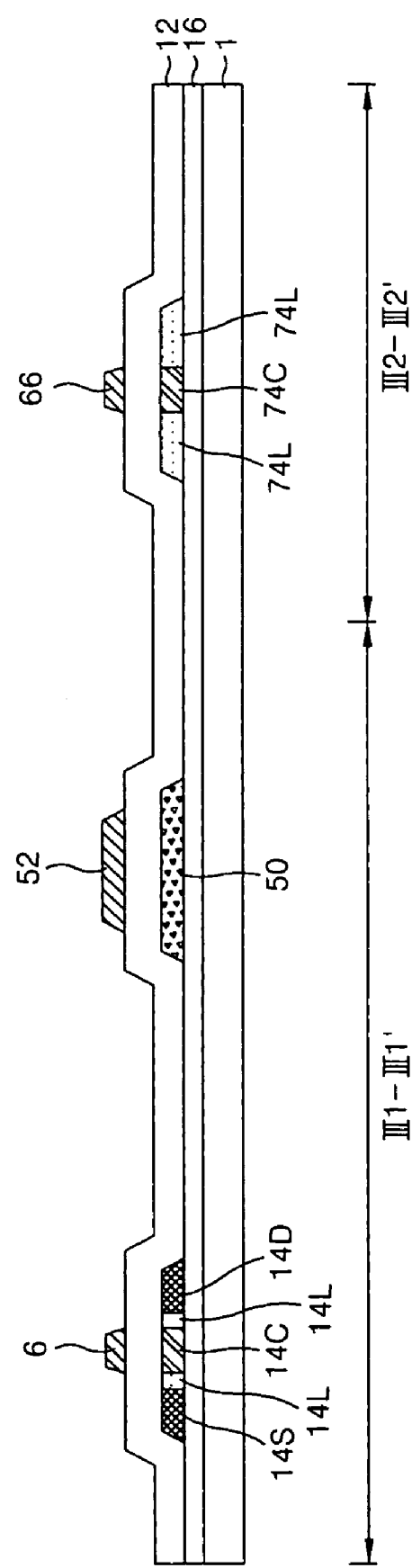

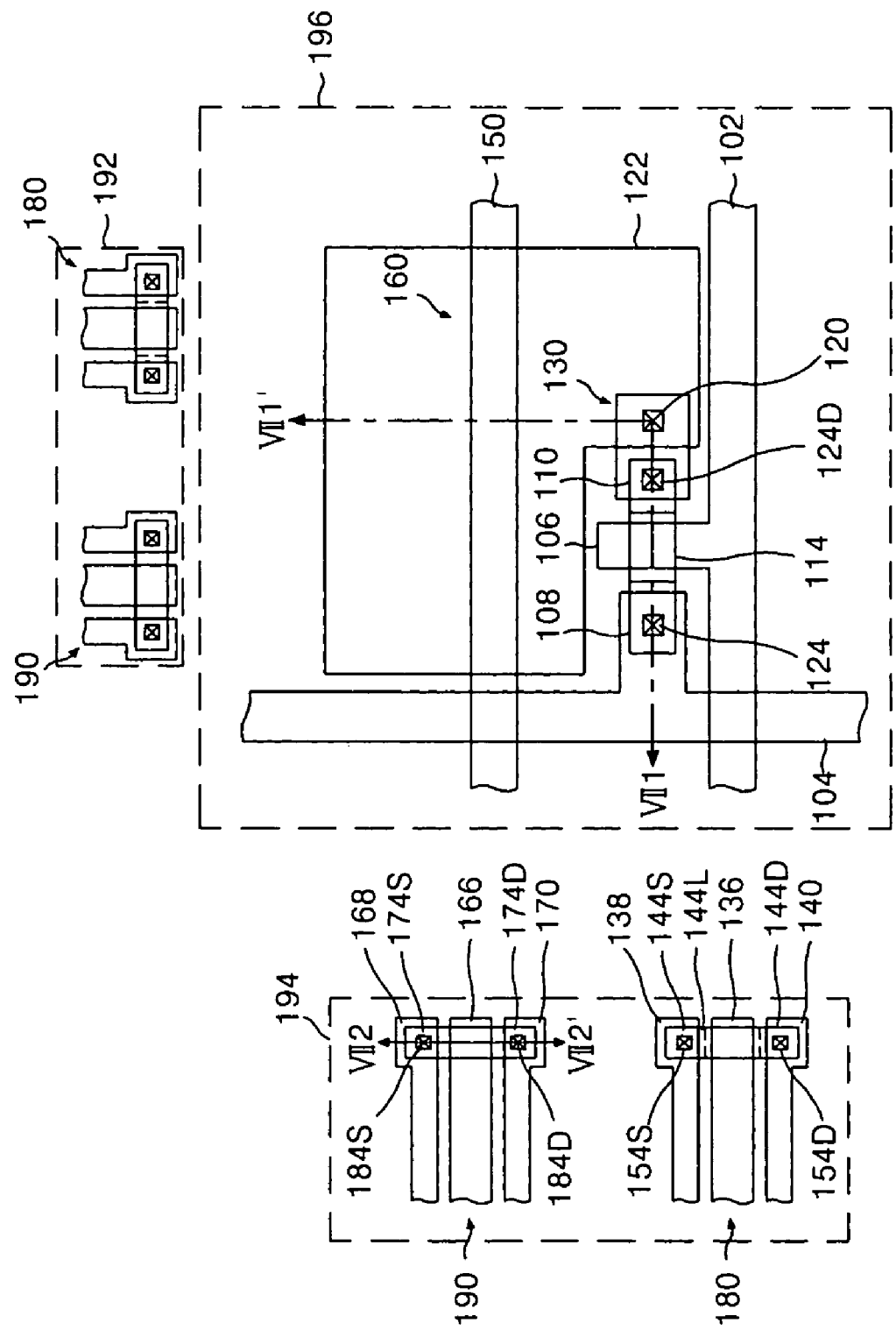

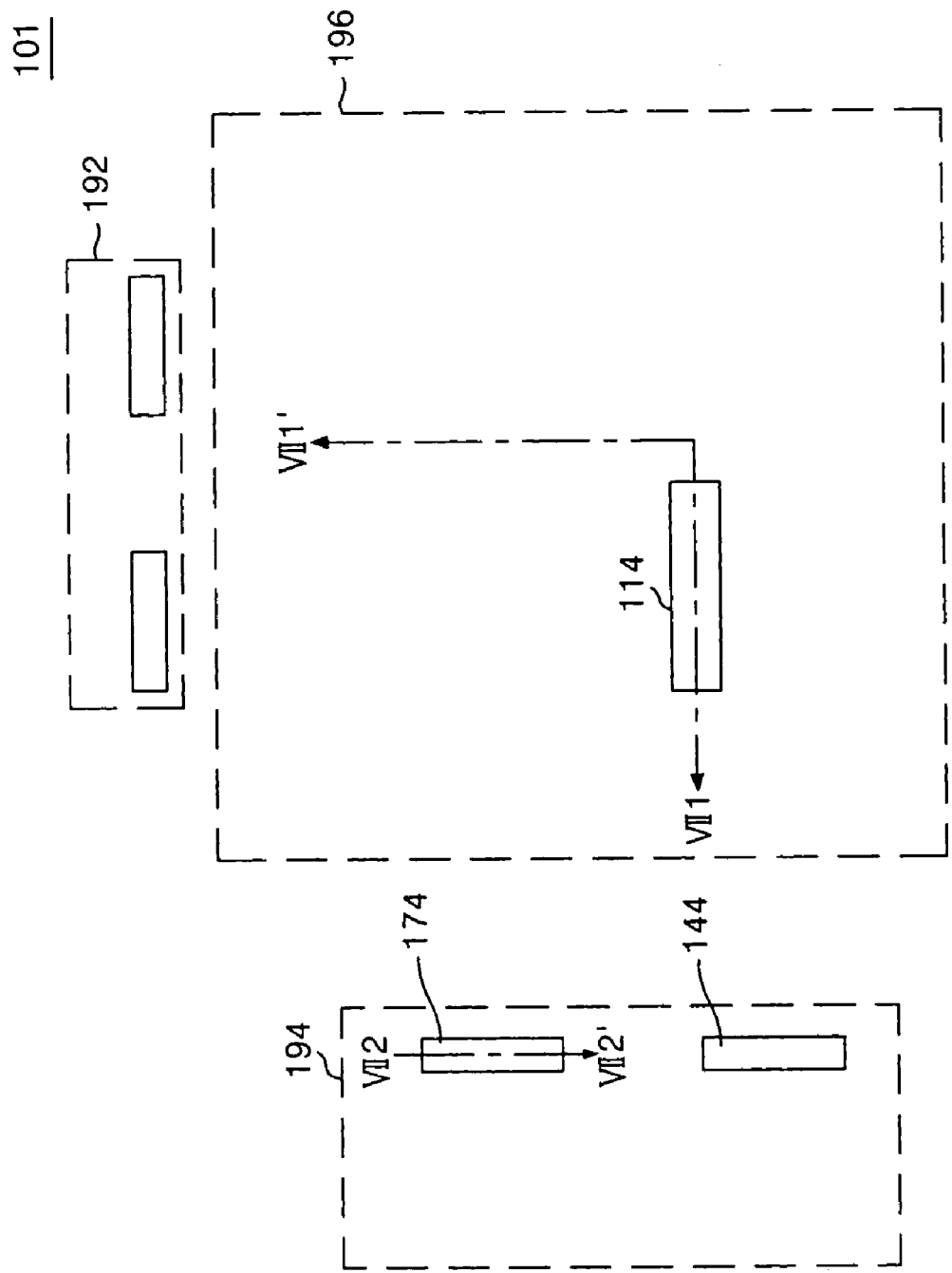

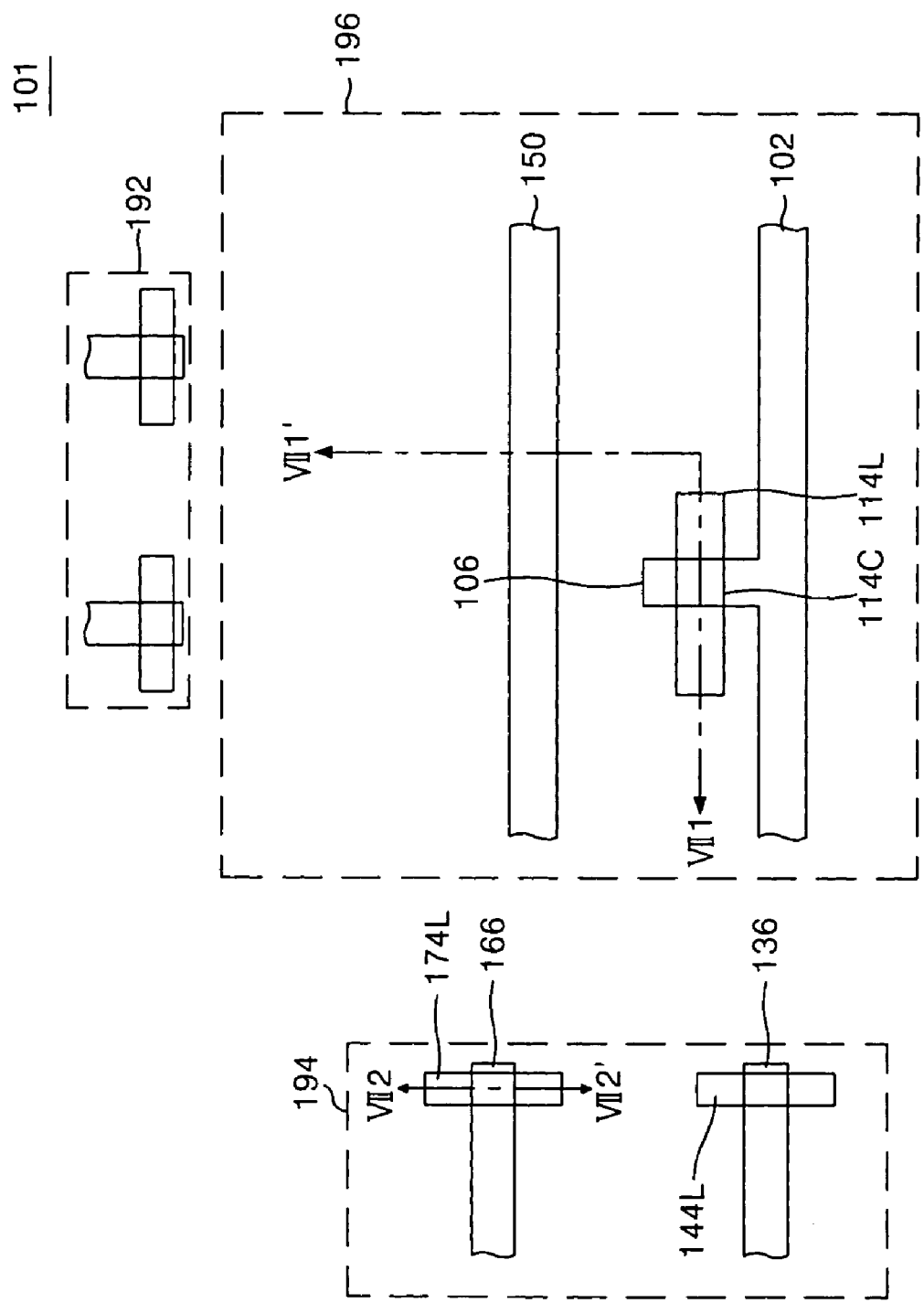

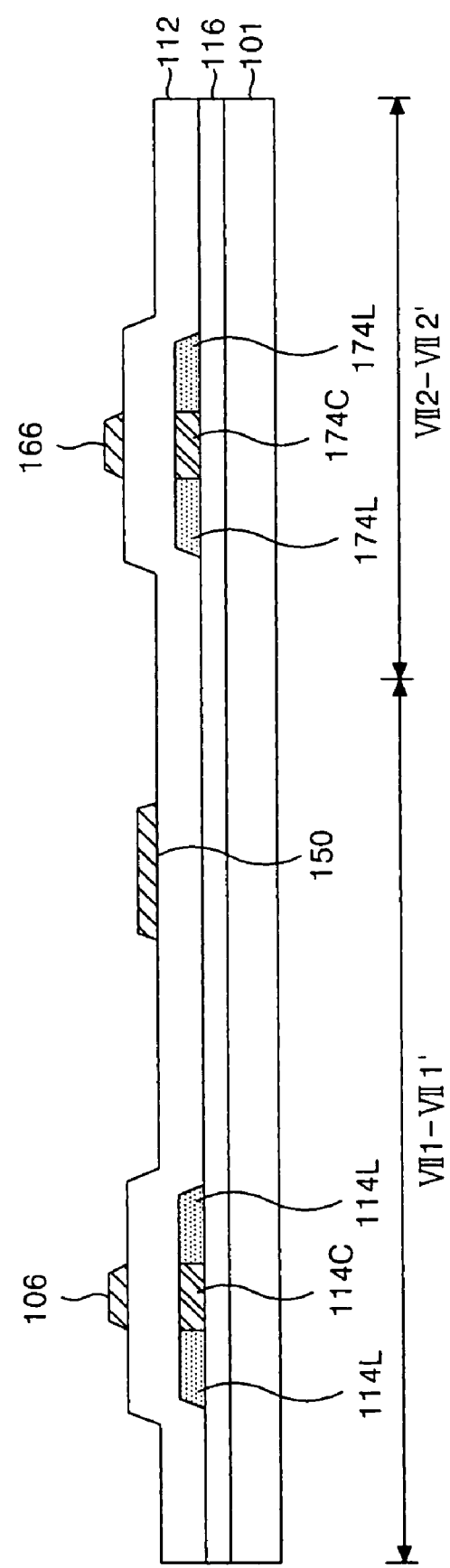

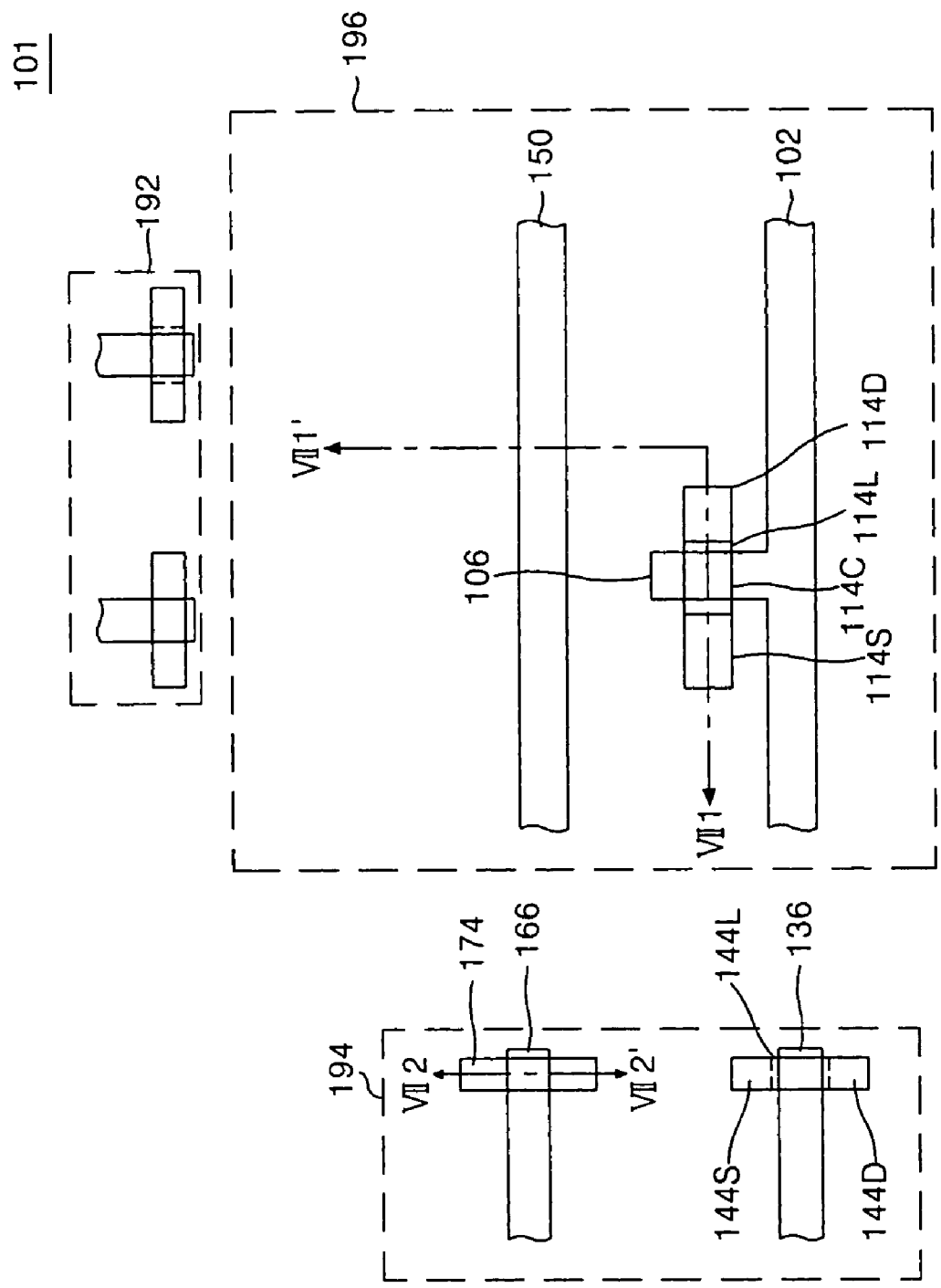

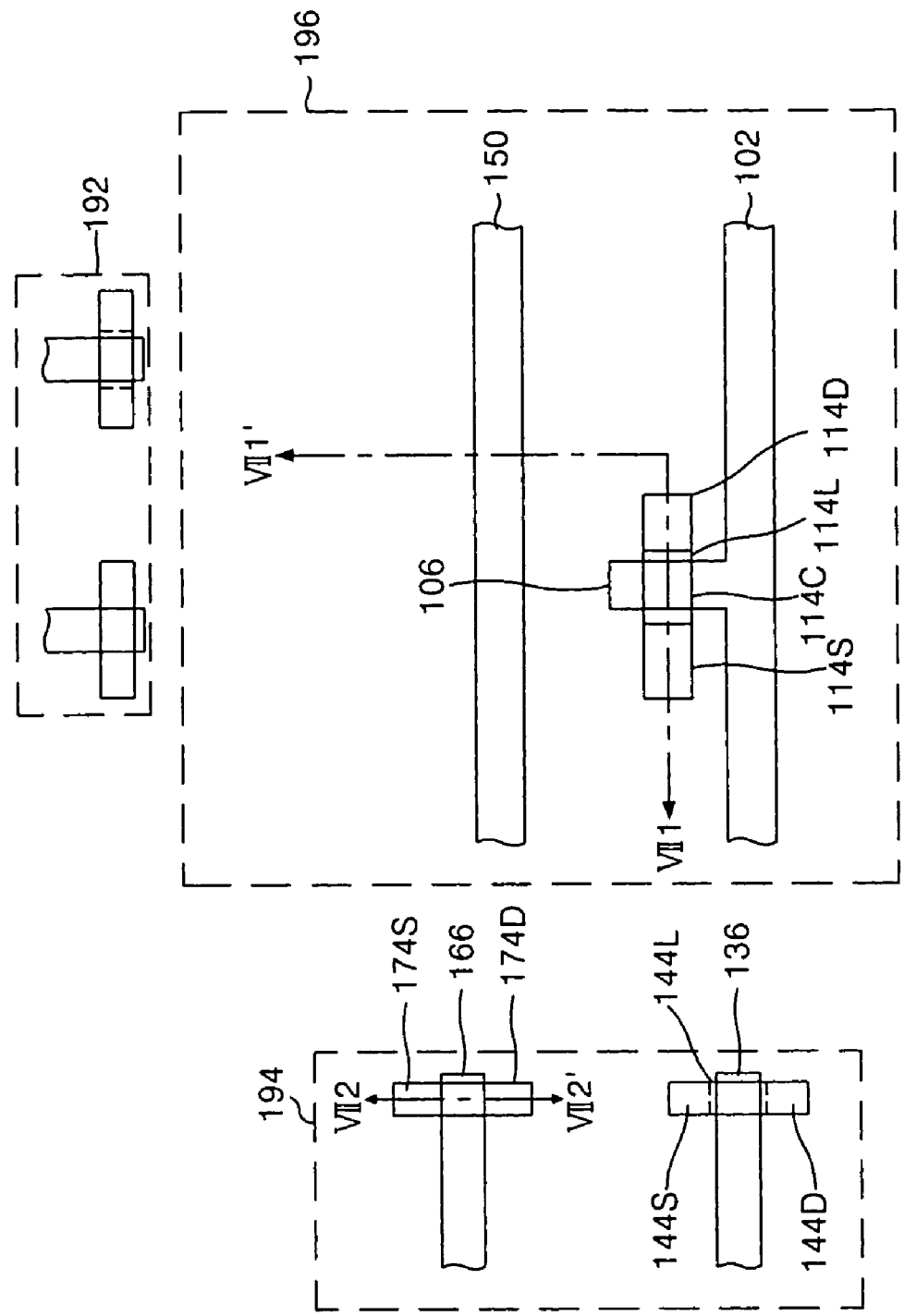

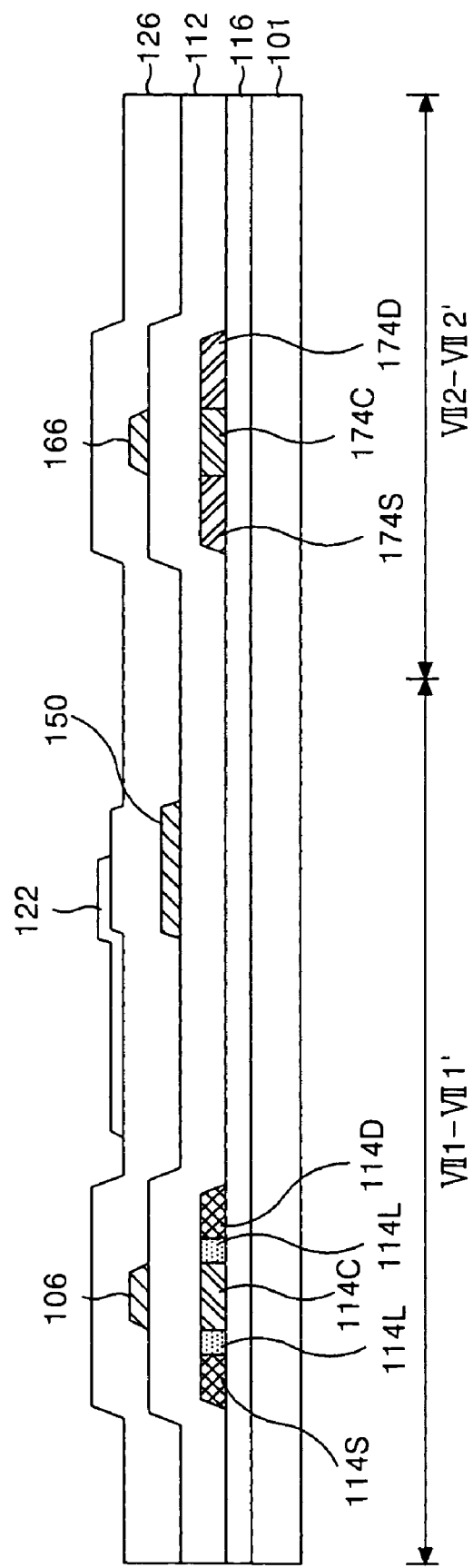

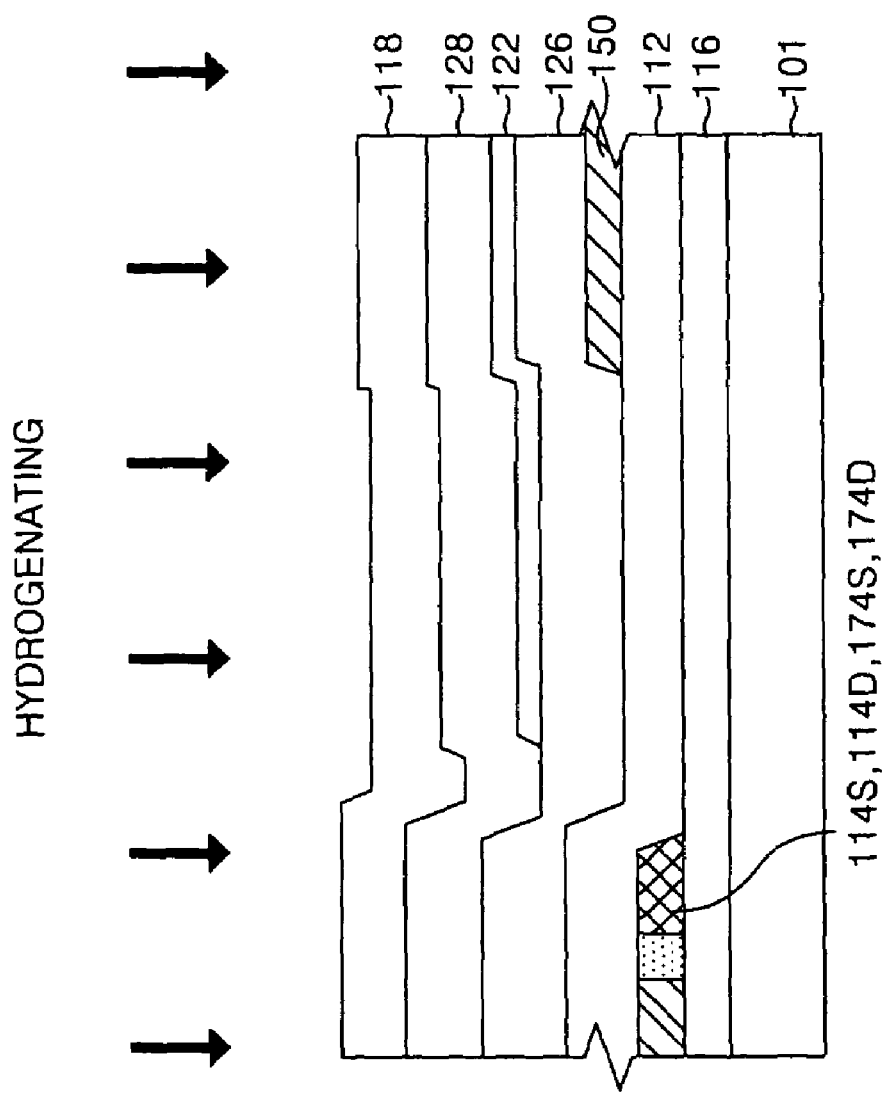

METHOD OF FABRICATING LIQUID CRYSTAL DISPLAY DEVICE

The present invention claims the benefit of Korean Patent Application No. P2003-94975, filed in Korea on Dec. 22, 2003, which is hereby incorporated by reference.

BACKGROUND OF THE INVENTION

1. Field of the Invention

The present invention relates to a method of fabricating a display device, and more specifically, to a method of fabricating a liquid crystal display (LCD) device.

2. Description of the Related Art

In general, an LCD device controls light transmittance of liquid crystal cells in accordance with video signals, thereby displaying images corresponding to the video signals on an LCD panel having the liquid crystal cells arranged in a matrix configuration. In the LCD device, a thin film transistor (TFT) is commonly used as a switching device for the liquid crystal cells. The thin film transistor includes a semiconductor layer made from amorphous silicon or polycrystalline silicon. The amorphous silicon TFT has an advantage because it has relatively good material uniformity and stable operational properties. However, an amorphous silicon TFT has a relatively slow response due to its low charge mobility. Thus, it is difficult to employ an amorphous silicon TFT as a high-resolution display panel that requires rapid response speeds or as a driving device for a gate driver and a data driver. Conversely, a polycrystalline silicon TFT has an advantage because it functions well in high resolution display panels and has peripheral driving circuits mounted on the display panel since the charge mobility of polycrystalline silicon is high.

FIG. 1 is a schematic plan view of a polycrystalline silicon LCD device according to the related art. In FIG. 1, an LCD device using a polycrystalline silicon TFT includes an image display part 96 having a pixel matrix, a data driver 92 for driving a data line 4 of the image display part 96, and a gate driver 94 for driving a gate line 2 of the image display part 96. The picture display part 96 displays images by arranging liquid crystal cells (LCs) in a matrix configuration. Each of the LCs includes a TFT that functions as a switching device connected to a crossing of the gate line 2 and the data line 4, and is made from polycrystalline silicon in which an N-type dopant is injected.

As shown in FIGS. 2 and 3, an N-type TFT 30 in the image display part 96 includes a gate electrode 6 connected to the gate line 2, a source electrode 8 connected to the data line 4, and a drain electrode 10 connected to a pixel electrode 22 via a pixel contact hole 20 passing through a passivation film 18. The gate electrode 6 is formed to overlap a channel area 14C of an active layer formed on a buffer film 16, with a gate insulating film 12 positioned between the gate electrode 6 and the channel area 14C. The source electrode 8 is formed to be insulated from the gate electrode 6 with an interlayer insulating film 26 therebetween, and contacts a source area 14S of the active layer to which $n^+$ ions are injected, via a source contact hole 24S. The drain electrode 10 is formed to be insulated from the gate electrode 6 with the interlayer insulating film 26 therebetween, and contacts a drain area 14D of the active layer to which the $n^+$ ions are injected, via a drain contact hole 24D. In addition, a lightly doped drain (LDD) area 14L to which $n^-$ ions are injected is formed between the channel area 14C and the drain area 14D on the active layer, thereby decreasing a relatively high OFF-current. Such an N-type TFT 30 responds to a scanning pulse supplied from the gate line 2 to allow a video signal, i.e., a pixel signal, supplied from the data line 4 to be charged in one of the LCs. Accordingly, the LC controls light transmittance in accordance with the pixel signal charged in the LC.

FIG. 2 is a plan view of a lower array substrate according to the related art. In FIG. 2, a storage capacitor 60 includes a lower storage electrode 50 having $PH_3$ injected into the active layer, and an upper storage electrode 52 overlapping the lower storage electrode 50 with the gate insulating film 12 positioned therebetween. The storage capacitor 60 allows a pixel signal charged in the pixel electrode 22 to be stably maintained until a next pixel signal is charged.

In FIG. 1, the gate driver 94 sequentially drives the gate lines 2 by horizontal intervals for each frame in response to gate control signals. The gate driver 94 causes the TFTs 30 to sequentially be turned ON for each horizontal line, thereby connecting the data line 4 to the LC. The data driver 92 samples digital data signals to convert the sampled signals into analog data signals for each horizontal period, and supplies the analog data signal to the data lines 4. Accordingly, the LCs connected to the turned-ON TFTs 30 control light transmittance in response to the analog data signals from the data lines 4.

The gate driver 94 and the data driver 92, respectively, include a CMOS structure having a plurality of driving P-type TFTs 90 and a plurality of driving N-type TFTs 80, as shown in FIGS. 2 and 3. In the driving P-type TFT 90, boron impurities are injected into a source area 74S and a drain area 74D on the active layer. In the driving N-type TFT 80, phosphorus impurities or arsenic impurities are injected into a source area 44S and a drain area 44D on the active layer. Furthermore, the driving N-type TFT 80 has an LDD area in order to decrease a high OFF-current in comparison with the driving P-type TFT 90.

Each of the driving N-type TFT 80 and the driving P-type TFT 90 includes active layers 44 and 74 formed on an upper portion of a buffer film 16 formed on a lower substrate 1, gate electrodes 36 and 66 formed to overlap the active layer 44 and 74 with a gate insulating film 12 positioned therebetween, and source electrodes 38 and 68, and drain electrodes 40 and 70 which are formed to insulate from the gate electrodes 36 and 66, and are contacted with the active layers 44 and 74.

FIG. 4 is a flow chart of a method of fabricating a lower array substrate according to the related art, and FIGS. 5A to 5I are cross sectional views along III1–III1' and III2–III2' of FIG. 2 of the method of fabricating a lower array substrate of FIG. 4 according to the related art.

At step S11, an insulating material such as a silicon oxide $SiO_2$ is deposited on the entire lower substrate 1, to form a buffer film 16 as shown in FIG. 5A. An amorphous silicon film is deposited on the lower substrate 1 with the buffer film 16 thereon. The amorphous silicon film is then crystallized by a laser, to thereby form a polycrystalline silicon film. The polycrystalline silicon film is patterned by photolithography process using a first mask and etching process, thereby forming an active pattern including an active layer 14 of a N-type TFT having a N-type TFT of the picture display part and a N-type TFT of the driver, an active layer 74 of a P-type TFT in the driver, and an active layer 54 of a storage capacitor.

At step S12, a photo-resist is deposited on the entire surface of the lower substrate 1 having the active pattern. The photo-resist is then patterned by a photolithography process using a second mask, to thereby form a photo-resist pattern. The photo-resist pattern serves to expose the active layer 54 of the storage capacitor and is formed to entirely cover the active layers 14 and 74 of the N-type TFT and the P-type TFT. $PH_3$ ions are injected into the active layer 54 of the storage capacitor by using the photo-resist pattern as a mask, so that a lower electrode 50 is formed as shown in FIG. 5B.

At step S13, an insulating material, such as silicon oxide $SiO_2$, is deposited on the entire lower substrate 1 having the lower storage electrode 50, thereby forming a gate insulating film 12, as shown in FIG. 5C. Then, a gate metal layer is deposited on the entire surface of the lower substrate 1 with the gate insulating film 12 thereon. The gate metal layer is then patterned by a photolithographic process using a third mask and an etching process, thereby forming a gate electrode 6 of the N-type TFT and a gate electrode 66 of the P-type TFT. For example, the gate metal layer may be made of an aluminum metal material, such as aluminum Al and aluminum/neodymium. Subsequently, the $n^-$ ions are injected into the active layer 14 of the N-type TFT and the active layer 74, respectively, by using the gate electrodes 6 and 66 as a mask. Thus, the active layers 14 and 74 overlapped with the gate electrode 6 of the N-type TFT and the gate electrode 66 of the P-type TFT become channel areas 14C and 74C, respectively, whereas, the active layers 14 and 74 not overlapped with the gate electrode 6 of the N-type TFT and the gate electrode 66 of the P-type TFT become LDD areas 14L and 74L, respectively.

At step S14, a photo-resist is deposited on the entire surface of the lower substrate 1. Then, the photo-resist is patterned by a photolithographic process using a fourth mask, thereby forming a photo-resist pattern. The photo-resist pattern serves to partially expose the active layer 14 of the N-type TFT and is formed to entirely cover an upper storage electrode 52 and the active layer 74 of P-type TFT. Subsequently, the $n^+$ ions are injected into the active layer 14 of the N-type TFT by using the photo-resist pattern as a mask, so that a source area 14S and a drain area 14D of the active layer 14 are formed, as shown in FIG. 5D.

At step S15, a photo-resist is deposited on the entire surface of the lower substrate 1 having the active layer 14 in which the $n^+$ ions are injected and then the photo-resist is patterned by a photolithography process using a fifth mask, thereby a photo-resist pattern is formed. The photo-resist pattern is formed so as to cover an area except for the active layer 74 of the P-type TFT. Then, $p^+$ ions are injected into the active layer 74 of the P-type TFT by using the photo-resist pattern as a mask, so that a source area 74S and a drain area 74D of the active layer 74 of the P-type TFT are formed, as shown in FIG. 5E.

At step S16, an insulating material is deposited on the lower substrate 1 having the active layer 74 to which $p^+$ ions are injected, so that an interlayer insulating film is formed, as shown FIG. 5F. Then, the photo-resist is patterned by a photolithographic process using a sixth mask and an etching process. Accordingly, a source contact hole 24S and a drain contact hole 24D exposing the source area 14S and the drain area 14D of the N-type TFT are formed, respectively, and a source contact hole 84S and a drain contact hole 84D exposing the source area 74S and the drain area 74D of the P-type TFT are formed, respectively.

At step S17, a data metal layer is deposited on the entire surface of the lower substrate 1 having the source contact holes 24S and 74S and the drain contact holes 24D and 74D, and then the data metal layer is patterned by a photolithographic process using a seventh mask and an etching process, so that a data pattern, including the source and the drain electrodes 8 and 10 of the N-type TFT, and the source and the drain electrode 68 and 70 of the P-type TFT are formed, as shown in FIG. 5G. The source electrodes 8 and 68 and the drain electrodes 10 and 70 are contacted with the source areas 14S and 74S and the drain area 14D and 74D of the active layer via the source contact holes 24S and 84S and the drain contact holes 24D and 84D, respectively.

At step S18, an insulating material is deposited on the entire surface of the lower substrate 1 having the data pattern, thereby forming a passivation film 18, as shown in FIG. 5H. The lower substrate 1 having the passivation film 18 is placed inside a chamber, and is subjected to a heat treatment process using hydrogen $H_2$. Accordingly, the hydrogen $H_2$ is diffused into the passivation film 18 by the heat treatment process. The diffused hydrogen $H_2$ is bonded with a dangling bond which does not bond with atoms in the active layers 44 and 74.

At step S19, the passivation film 18 is patterned by a photolithographic process using an eighth mask and an etching process, so that a pixel contact hole 20 is formed to expose the drain electrode 10 of the N-type TFT in the picture display part. Subsequently, a transparent conductive material is deposited on the entire surface of the lower substrate 1 having the passivation film 18, and the transparent conductive material is patterned by a photolithographic process using a ninth mask and an etching process, thereby forming a pixel electrode 22, as shown in FIG. 5I. Accordingly, the pixel electrode 22 is electrically connected to the drain electrode 10 of the N-type TFT in the picture display part.

According to the related art, the fabricating method of a polycrystalline silicon TFT employs a nine mask process. In addition, since each mask process includes a plurality of sub-processes, such as deposition, cleaning, photolithography, etching, photo-resist stripping, and inspection, the fabricating process is very complicated and increases fabrication costs.

SUMMARY OF THE INVENTION

Accordingly, the present invention is directed to a method of fabricating an LCD device that substantially obviates one or more of the problems due to limitations and disadvantages of the related art.

An object of the present invention is to provide a method of fabricating an LCD device having a simplified fabricating process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a liquid crystal display device includes forming a first active layer on a substrate, forming a first gate insulating film on the first active layer, forming a first gate electrode on the first gate insulating film, forming a first interlayer insulating layer on the first gate electrode, forming a pixel electrode on the first interlayer insulating layer, forming at least one insulating film to cover the pixel electrode, forming a first plurality of contact holes in the first interlayer insulating layer and the at least one insulating film, the first plurality of contact holes including a first source contact hole to expose a first source area of the first active layer and a first drain contact hole to expose a first drain area of the first active layer, forming a pixel contact hole in the at least one insulating film to expose the pixel electrode, performing a hydrogenating treatment to the substrate including the first source contact hole, the first drain contact hole, and the pixel contact hole, and forming a first source electrode contacting the first source area of the first active layer, and a first drain electrode contacting the direct drain area of the first active layer and connected to the pixel electrode.

In another aspect, a method of fabricating a liquid crystal display device includes forming a plurality of active layers on a substrate, forming a gate insulating film on each of the plurality of active layers, forming a plurality of gate electrodes on the gate insulating film, each of the plurality of gate electrodes corresponds with each of the plurality of active layers, forming an interlayer insulating layer on the plurality of gate electrodes, forming a pixel electrode on the interlayer insulating layer, forming at least one insulating film to cover the pixel electrode, forming a plurality of contact holes in the interlayer insulating layer and the at least one insulating film, each of the plurality of contact holes exposing portions of each of the plurality of active layers and the pixel electrode, performing a hydrogenating treatment to the substrate including the plurality of contact holes, forming a plurality of electrodes contacting each of the exposed portions of each of the plurality of active layers through the plurality of contact holes, wherein at least one of the plurality of electrodes electrically interconnects one of the exposed portions of the plurality of active layers with the pixel electrode.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiment of the present invention with reference to the accompanying drawings, in which:

FIGS. 5A to 5I are cross sectional views along III1–III1' and III2–III2' of FIG. 2 of a method of fabricating a lower array substrate according to the related art;

FIG. 6 is a plan view of an exemplary polycrystalline silicon LCD device according to the present invention;

FIG. 9A is a plan view of an exemplary first mask process of an LCD device, according to the present invention;

FIG. 10A is a plan view of an exemplary second mask process of an LCD device according to the present invention;

FIG. 10B is a cross sectional view along VII1–VII1' and VII2–VII2' of FIG. 10A according to the present invention;

FIG. 11A is a plan view of an exemplary third mask process of an LCD device according to the present invention;

FIG. 12A is a plan view of an exemplary fourth mask process of an LCD device according to the present invention;

FIG. 13B is a cross sectional view along VII1–VII1' and VII2–VII2' of FIG. 13A according to the present invention;

FIGS. 15A to 15C are cross sectional views of a hydrogenated heat treatment;

DETAILED DESCRIPTION OF THE PREFERRED EMBODIMENTS

Reference will now be made in detail to the preferred embodiments of the present invention, examples of which are illustrated in the accompanying drawing.

Figure 1:
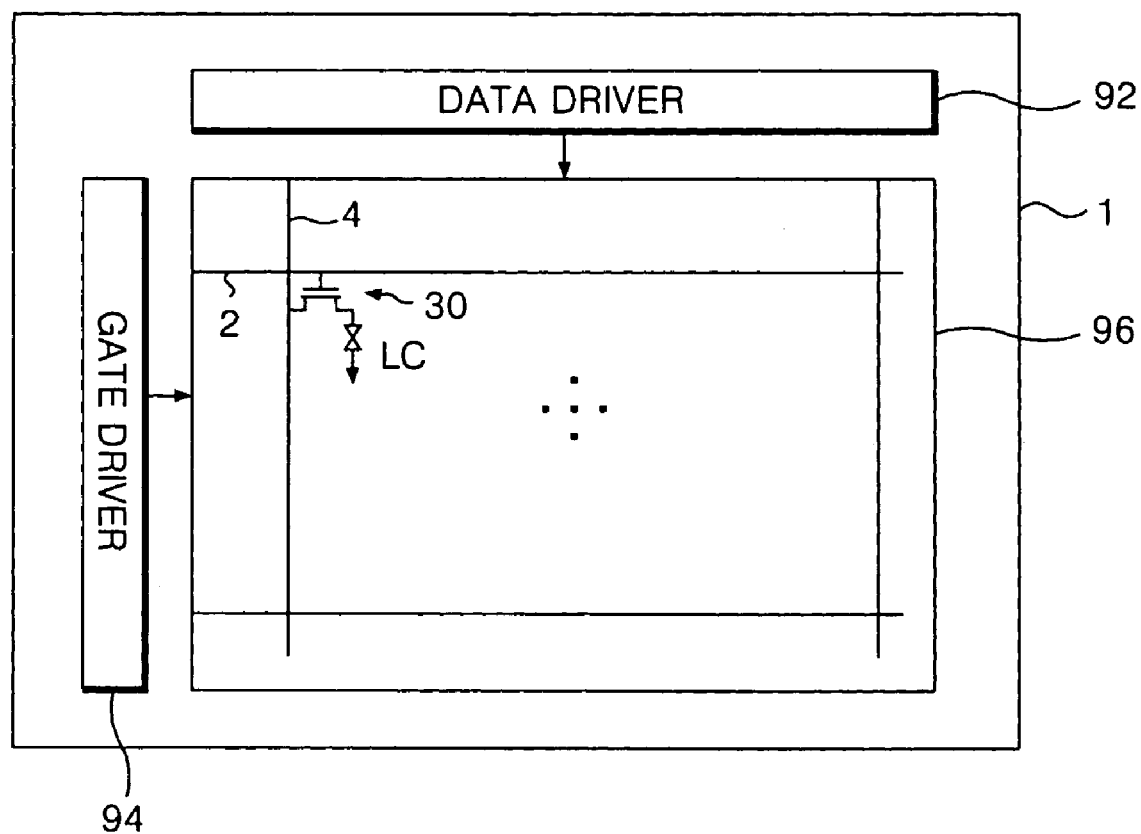
FIG. 1 is a schematic plan view of a polycrystalline silicon LCD device according to the related art.
Figure 2:
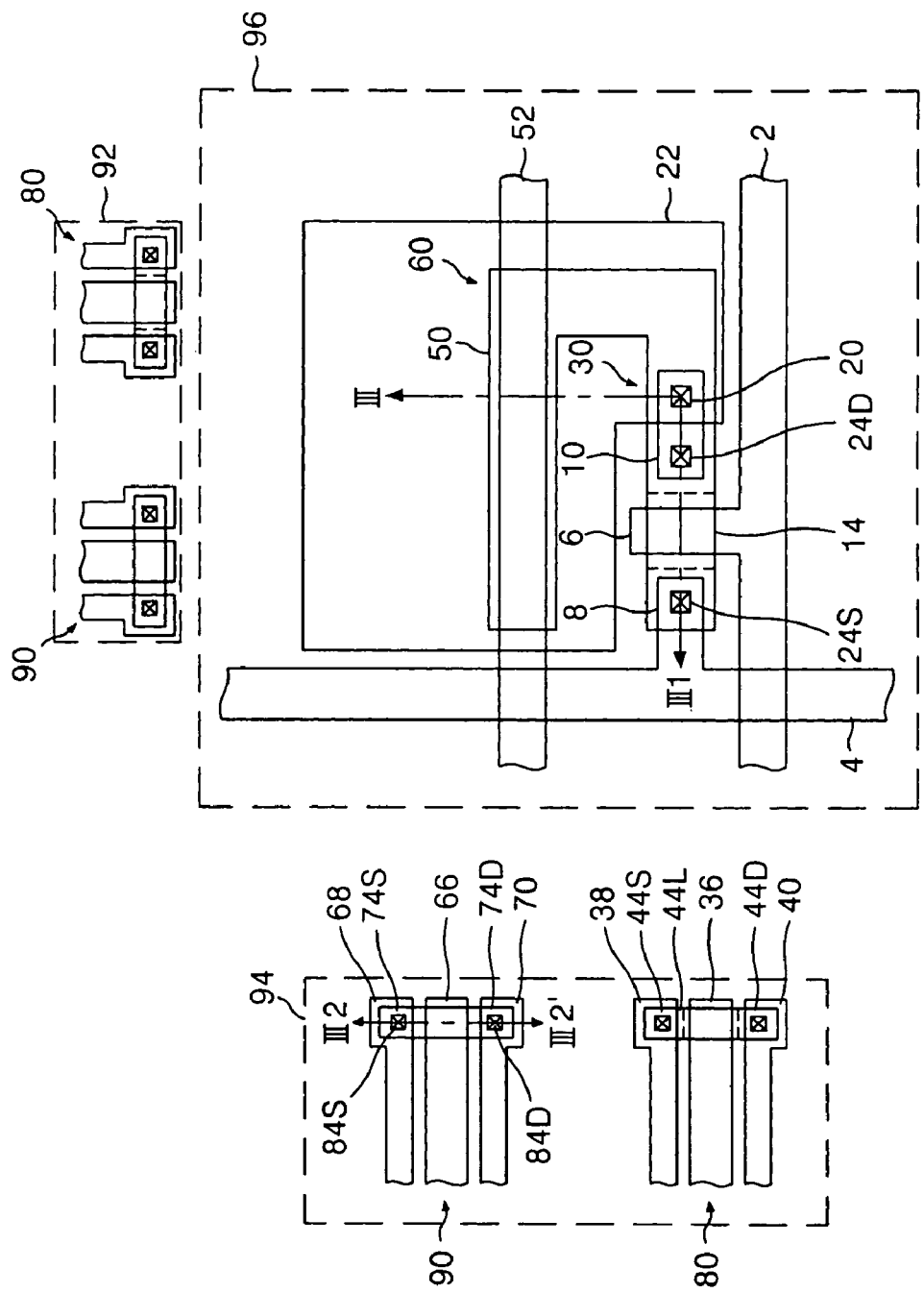
FIG. 2 is a plan view of a lower array substrate according to the related art.
Figure 3:
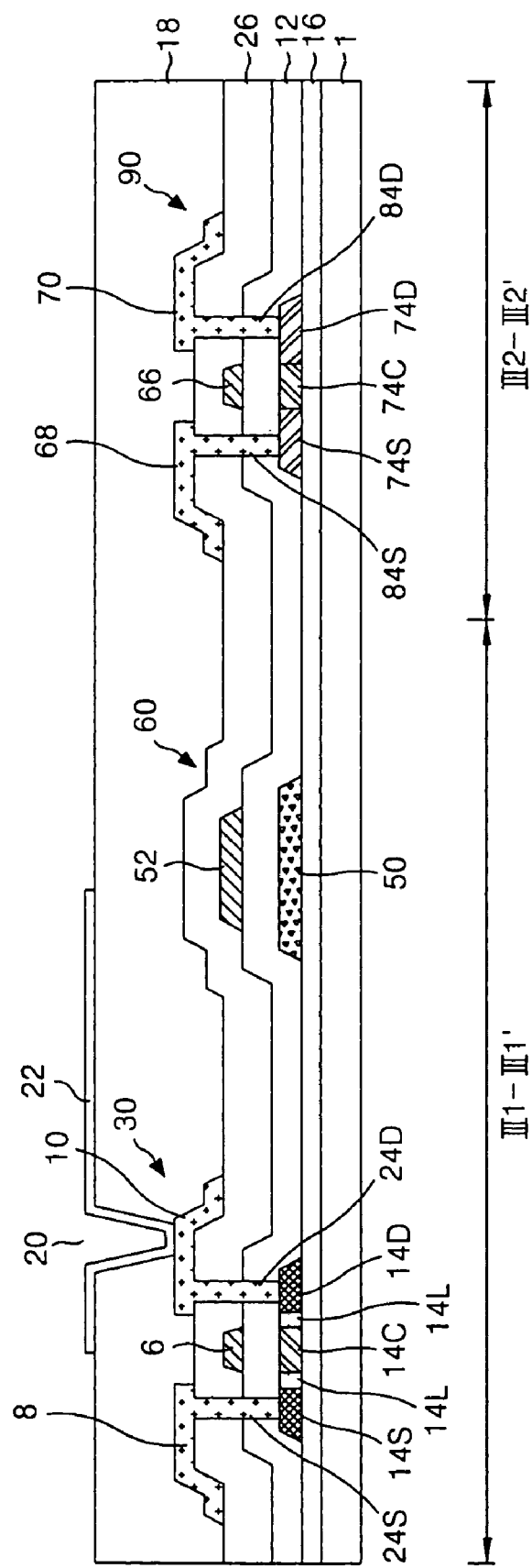
FIG. 3 a cross sectional view along III1–III1' and III2–III2' of FIG. 2 according to the related art.
Figure 4:
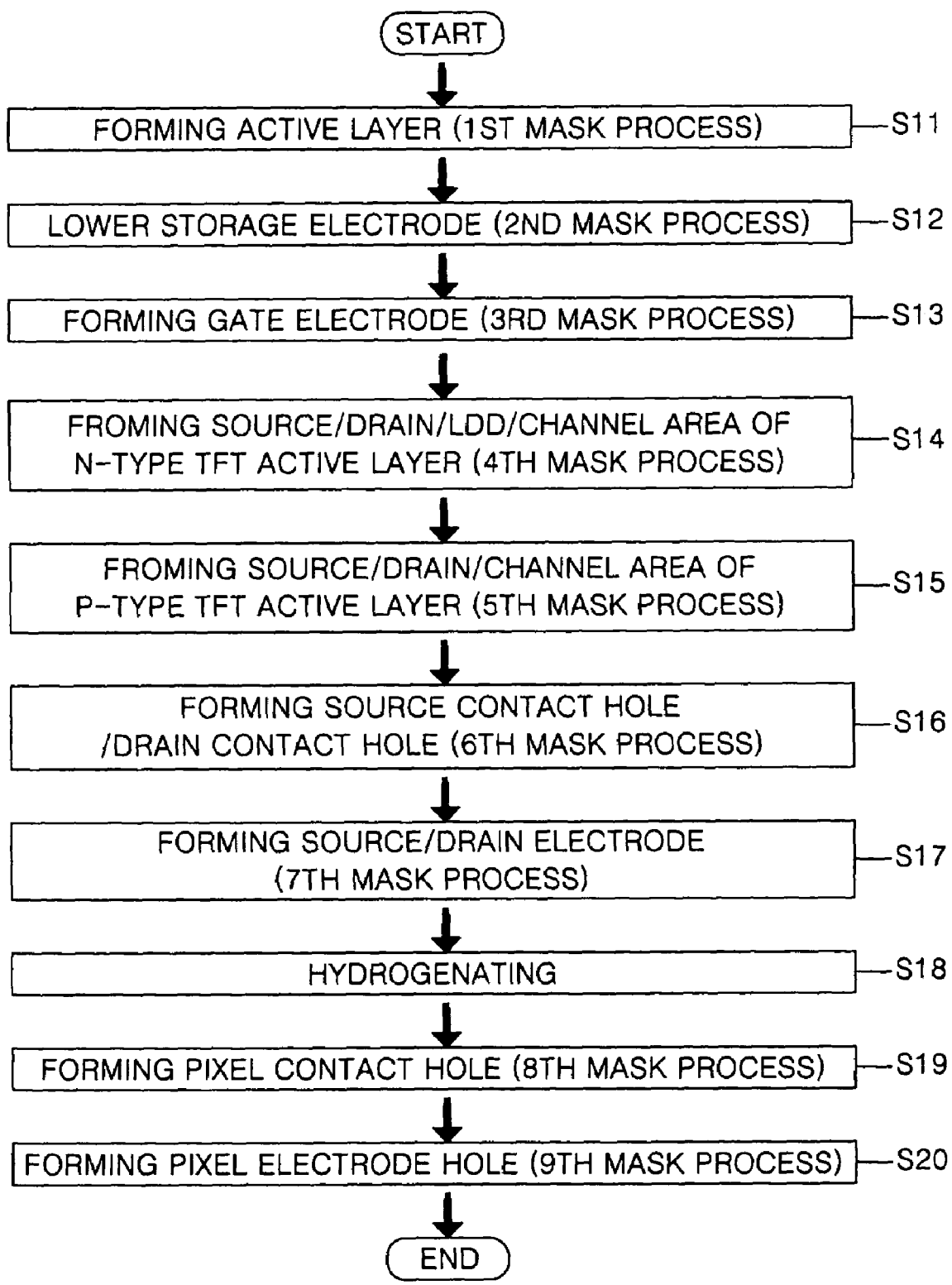
FIG. 4 is a flow chart of a method of fabricating a lower array substrate according to the related art.
Figure 5A:
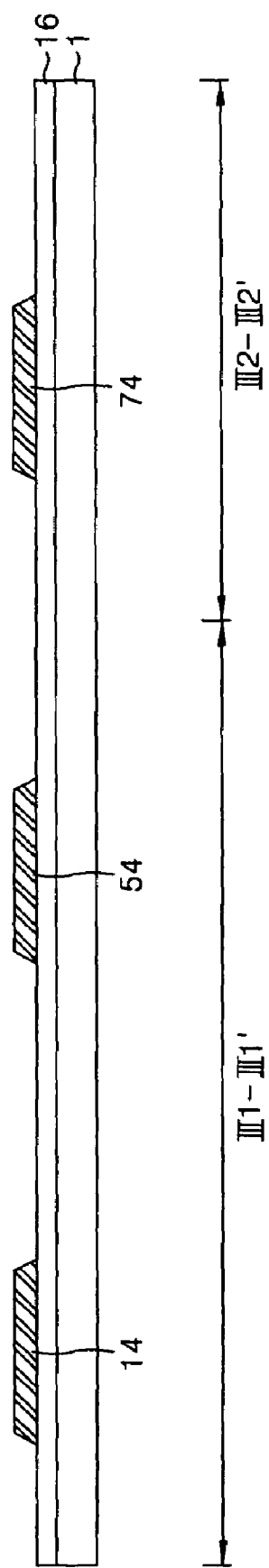
Figure 5B:
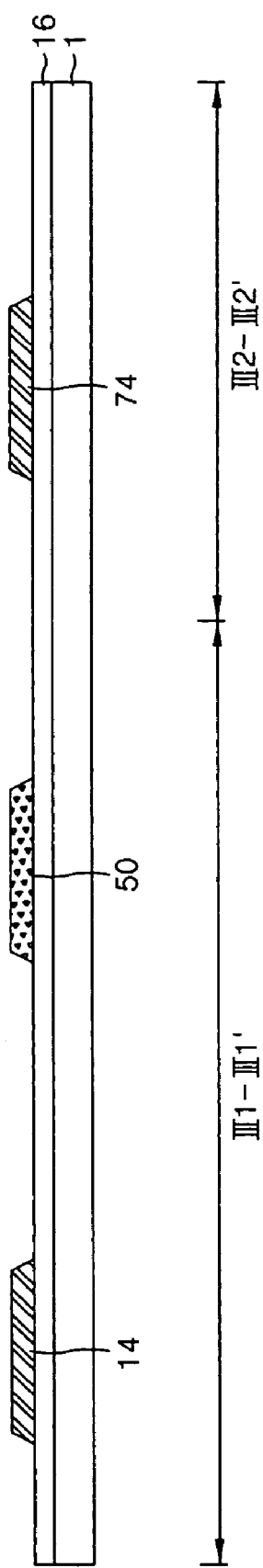
Figure 5E:
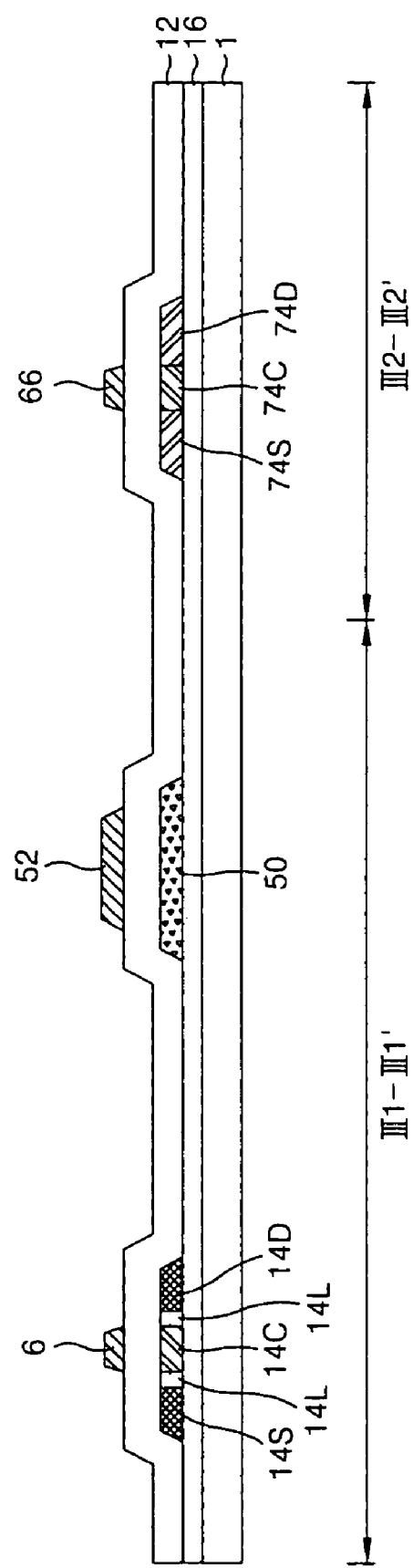
Figure 5F:
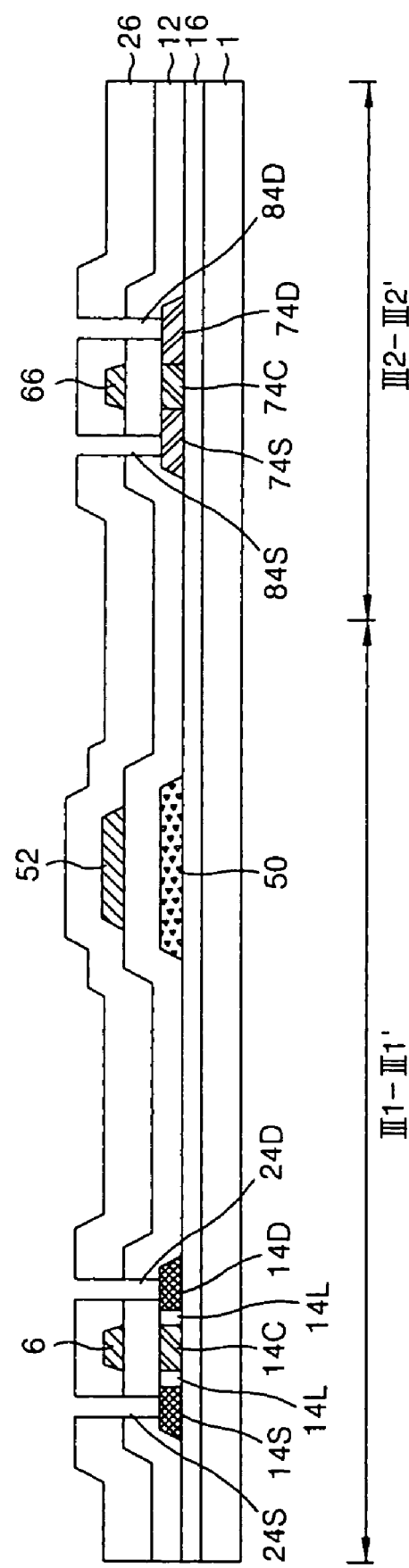
Figure 5G:
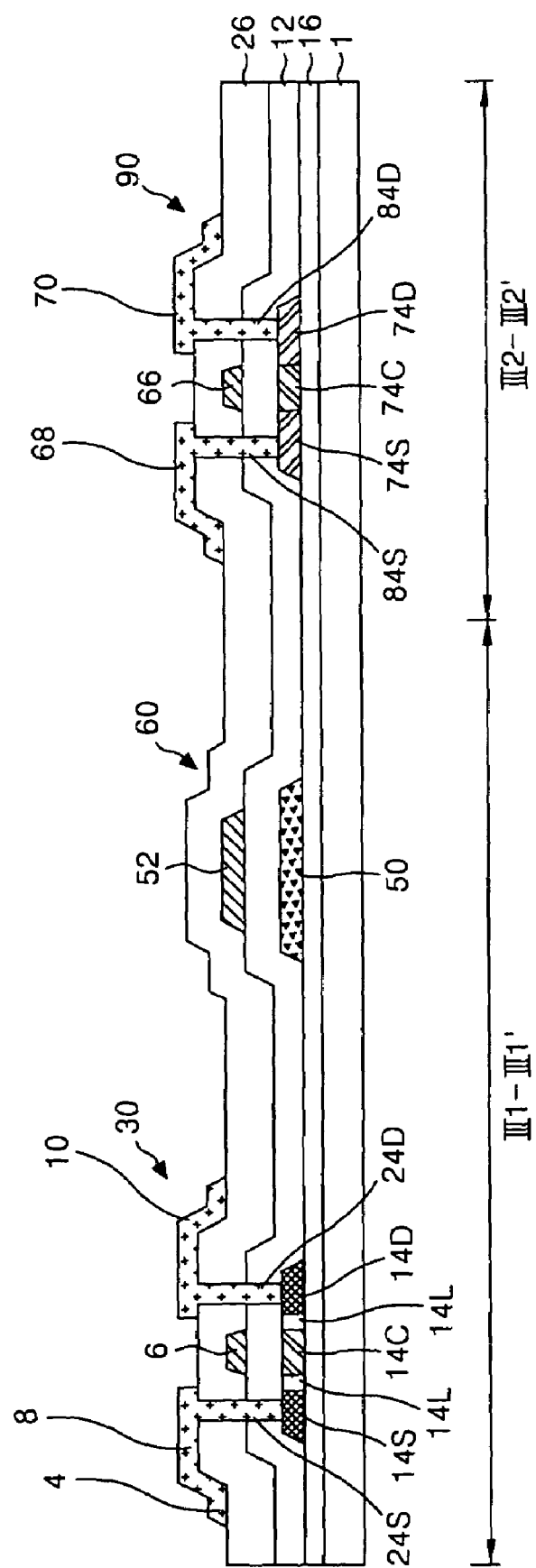
Figure 5H:
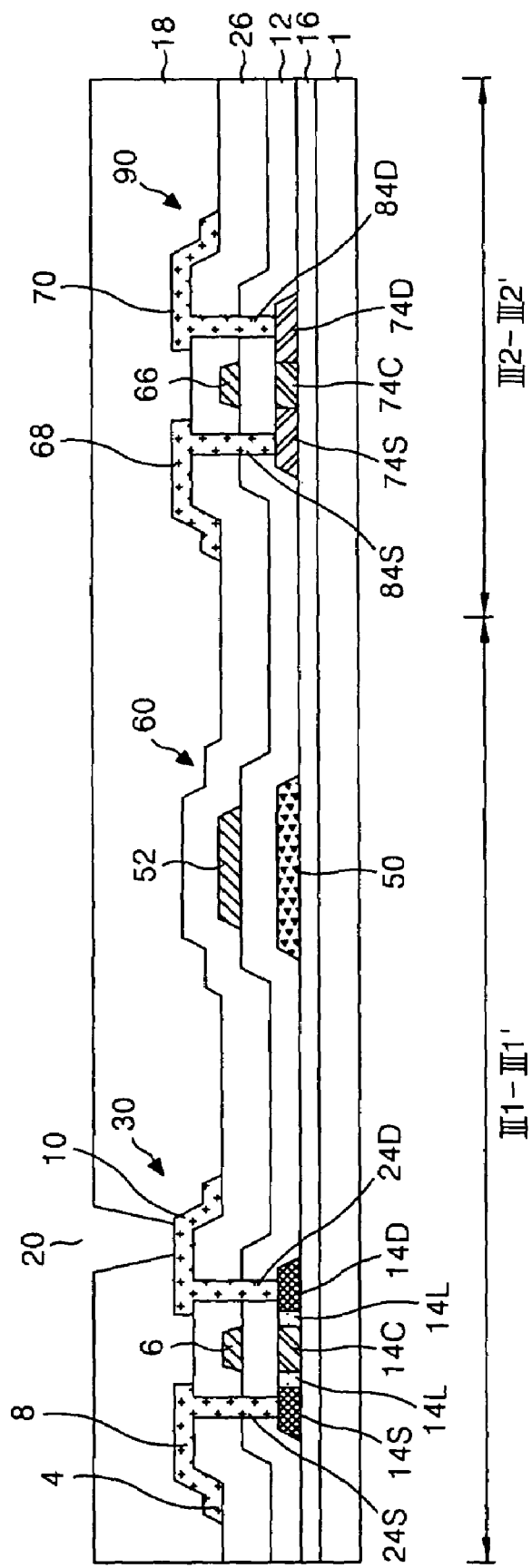
Figure 51:
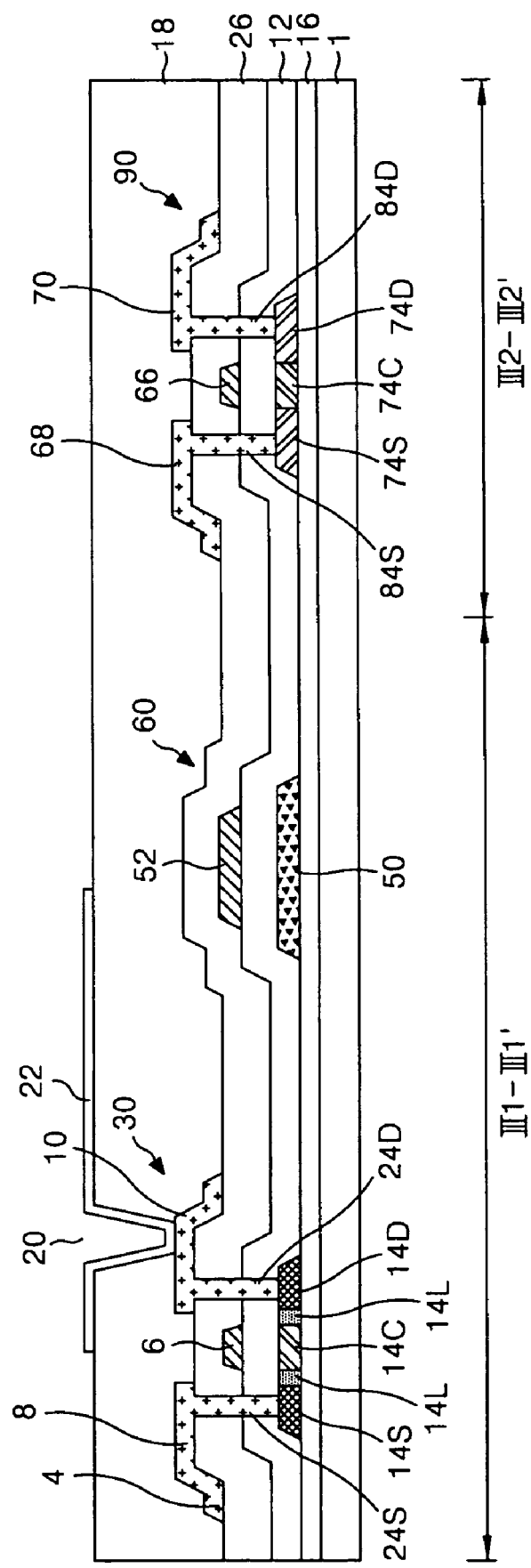
Figure 7:
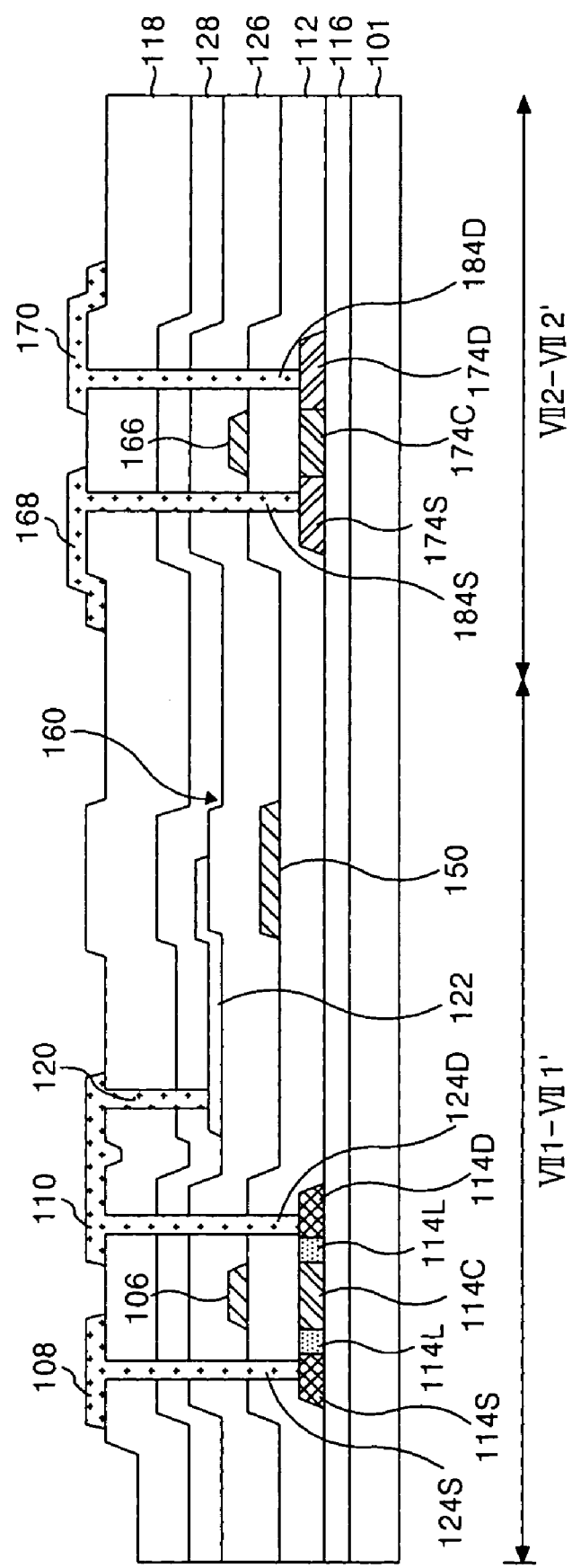
FIG. 7 is a cross sectional view along VII1–VII1' and VII2–VII2' of FIG. 6 according to the present invention.

FIG. 6 is a plan view of an exemplary polycrystalline silicon LCD device according to the present invention, and FIG. 7 is a cross sectional view along VII1–VII1' and VII2–VII2' of FIG. 6 according to the present invention. In FIGS. 6 and 7, an LCD device may include a polycrystalline silicon type TFT that may include an image display part 196 having a matrix configuration of pixels, a data driver 192 for driving a data line 104 of the image display part 196, and a gate driver 194 for driving a gate line 102 of the image display part 196. The image display part 196 may include a gate line 102 and a data line 104 intersected and insulated from each other, an N-type TFT 130 of the image display part located at the intersection of the gate line 102 and the data line 104, a pixel electrode 122 formed at an area defined by the intersection of the gate line 102 and the data line 104 and connected to the N-type TFT 130.

The N-type TFT 130, in response to a scanning pulse supplied from the gate line 102, may allow a video signal, i.e., a pixel signal, supplied from the data line 104 to be charged in a liquid crystal cell LC. Accordingly, the N-type TFT 130 of the image display part 196 may include a gate electrode 106 connected to the gate line 102, a source electrode 108 connected to the data line 104, and a drain electrode 110 connected to a pixel electrode 122 via a pixel contact hole 120 passing through a second interlayer insulating film 128 and a passivation film 118. The N-type TFT 130 of the image display part 196 may further include an active layer 114 overlapping the gate electrode 106 with a gate insulating film 112 positioned therebetween to form a channel between the source electrode 108 and the drain electrode 110. The active layer 114 may include a channel area 114 overlapping the gate electrode 106, a source area 114S to which the source electrode 108 is contacted via a source contact hole 124S and n⁺ ions are injected, a drain area 114D to which the drain electrode 110 is contacted via a drain contact hole 124D and n⁺ ions are injected, and an LDD area 114L formed between the channel area 114C and the drain area 114D and between the channel area 114C and the source area 114S. Thus, the source contact hole 124S and the drain contact hole 124D may function to expose the source electrode 108 and the drain electrode 110, respectively, passing thorough the gate insulating film 112, the first interlayer insulating film 126 and the second interlayer insulating film 128.

The pixel electrode 122 may be made of a transparent conductive material on a buffer film 116. In addition, the pixel electrode 122 may be electrically connected to the drain electrode 110 via the pixel contact hole 120 passing through the second interlayer insulating film 128 and the passivation film 118. As a result, an electric field may be formed between the pixel electrode 122 to which the pixel signal is supplied via the N-type TFT 130 of the image display part 196 and the common electrode (not shown) to which a reference voltage may be supplied. Accordingly, liquid crystal molecules formed between a thin film transistor array substrate and a color filter array substrate may rotate due to a dielectric anisotropy by the electric field. Thus, light transmittance transmitted through the pixel area may be changed depending on a rotating degree of the liquid crystal molecules, thereby displaying images.

In FIG. 7, a storage capacitor 160 may include a storage electrode 150 on the gate insulating film 112 and the pixel electrode 122 overlapped with the storage electrode 150 with the first interlayer insulating film 126 therebetween. Accordingly, the storage electrode 150 may be simultaneously formed with a gate pattern having the gate line 102. Thus, the storage capacitor 160 may allow a pixel signal charged in the pixel electrode 122 to be stably maintained until a next pixel signal is charged.

In FIG. 6, the gate driver 194 may sequentially drive the gate lines 102 by a horizontal interval for each frame in response to gate control signals. The gate driver 194 may cause the thin film transistors 130 to be sequentially turned-ON for each horizontal line, thereby connecting the data line 104 to the liquid crystal cell.

The data driver 192 may sample a plurality of digital data signals to convert the sampled signals into analog data signals for each horizontal interval, and may supply the analog data signal to the data lines 104. Accordingly, the liquid crystal cells connected to the turned-ON thin film transistors 130 may control the light transmittance in response to data signals from the data lines 104.

The gate driver 194 and the data driver 192, respectively, may include a CMOS structure having a plurality of driving P-type TFTs 190 and a plurality of driving N-type TFTs 180. In the driving P-type TFT 190, boron impurities may be injected into a source area 174S and a drain area 174D on the active layer. In the driving N-type TFT 180, phosphorus impurities or arsenic impurities may be injected into a source area 144S and a drain area 144D on the active layer. Furthermore, the driving N-type TFT 180 may be provided with an LDD area in order to decrease a high OFF-current in comparison with the driving P-type TFT 190.

Each of the driving N-type TFTs 180 and the driving P-type TFTs 190 may include active layers 144 and 174 formed on a buffer film 116, gate electrodes 136 and 166 formed to overlap with the active layer 144 and 174 with a gate insulating film 112 therebetween, source electrodes 138 and 168, and drain electrodes 140 and 170 which may be formed to be insulated from the gate electrodes 136 and 166 with the first and second interlayer insulating films 126 and 128 and the passivation film 118 therebetween, and may be contacted with the active layers 144 and 174 via a source contact hole 184S and a drain contact hole 184D. Thus, the source contact hole 184S and the drain contact hole 184D may function to expose the source electrode 108 and the drain electrode 110, respectively, via the first and the second interlayer insulating film 126 and 128 and the passivation film 118.

Figure 8:
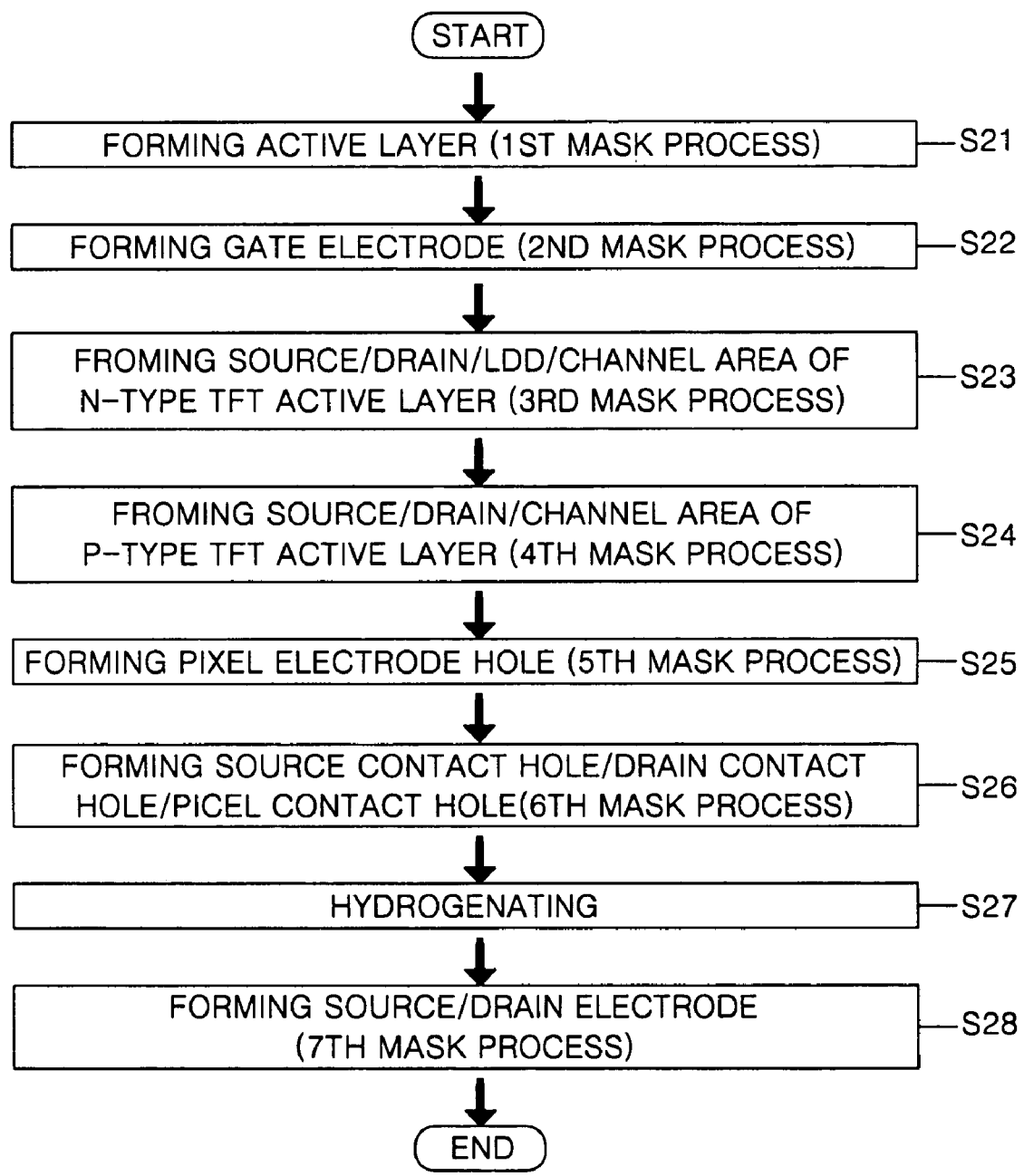
FIG. 8 is a flow chart of an exemplary method of fabricating a lower array according to the present invention.

An exemplary LCD device according to the present invention may include exemplary first to seventh mask processes as shown in FIG. 8, which will be described in detail in conjunction with FIGS. 9 to 16.

Figure 9B:
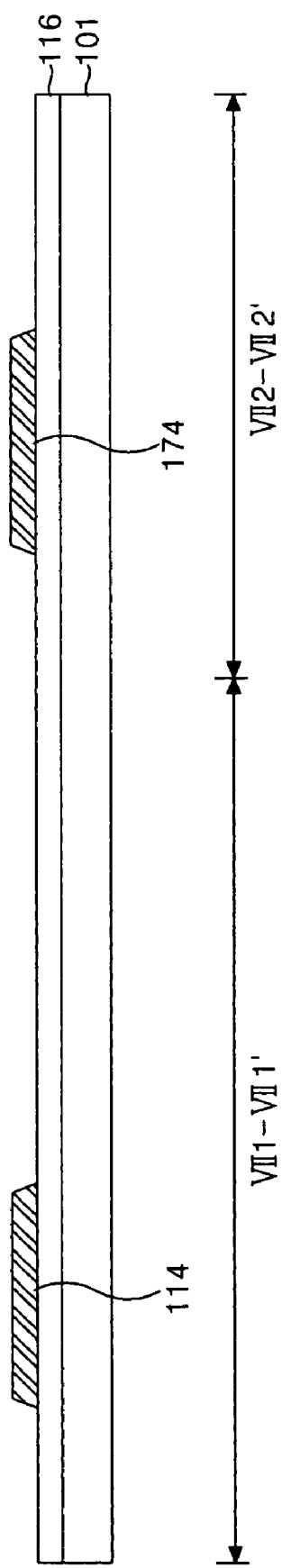
FIG. 9B is a cross sectional view along VII1–VII1' and VII2–VII2' of FIG. 9A according to the present invention.

FIG. 9A is a plan view of an exemplary first mask process of an LCD device, according to the present invention, and FIG. 9B is a cross sectional view along VII1–VII1' and VII2–VII2' of FIG. 9A according to the present invention. In FIGS. 9A and 9B, at step S21, a buffer film 116 may be formed on a lower substrate 101 by a deposition method, such as sputtering and plasma enhanced chemical vapor deposition (PECVD). The buffer film may be made from an inorganic insulating material, such as a silicon oxide ($SiO_2$) and a silicon nitride (SiNx). In addition, an active pattern that may include an active layer 114 of the N-type TFT 130 and an active layer 174 of the P-type TFT 190 may be formed during the first mask process.

For example, an amorphous silicon film may be formed along an entire surface of a lower substrate 101 having the buffer film 116 using a deposition method, such as sputtering and PECVD. Then, a dehydrogenating process may be performed to heat the amorphous silicon film to about 400° C. to prevent deterioration of an efficiency of subsequently-formed crystalline process due to the hydrogen included in the amorphous silicon film. The dehydrogenating process removes the hydrogen included in the amorphous silicon film. After removing the hydrogen, the amorphous silicon film may be crystallized by a laser to be converted into a polycrystalline silicon film. Subsequently, a photo-resist may be formed along an entire surface of the polycrystalline silicon film. Then, the photo-resist may be patterned by a photolithographic process using the first mask, thereby forming a photo-resist pattern. Next, the polycrystalline silicon film may be patterned by an etching process using the photo-resist pattern as a mask, thereby forming an active layer 114 of the N-type TFT 130 in the image display part 196, an active layer 144 of the N-type TFT 180 in the gate driver 194 and an active layer 174 of the P-type TFT 190 in the gate driver 194.

FIG. 10A is a plan view of an exemplary second mask process of an LCD device according to the present invention, and FIG. 10B is a cross sectional view along VII1–VII1' and VII2–VII2' of FIG. 10A according to the present invention. In FIGS. 10A and 10B, at step S22, a gate insulating film 112 may be formed on the lower substrate 101 having the active layers 114, 144, and 174, wherein the gate insulating film 112 may be made of an inorganic insulating material, such as a silicon oxide ($SiO_2$). Then, a gate pattern, including a gate electrode 106 of the N-type TFT 130 in the image display part 196, a gate electrode 136 of the N-type TFT 180 in the gate driver 194 and a gate electrode 166 of the P-type TFT 190 in the gate driver 194, may be formed during the second mask process.

For example, a gate metal layer and a photo-resist may be deposited along an entire surface of the gate insulating film 112 by a deposition method, such as sputtering, wherein the gate metal layer may be made of an aluminum metal material(s). Then, the gate metal layer may be patterned by an etching process using the photo-resist pattern as a mask, which may be formed by a photolithographic process using the second mask, thereby forming a gate electrode 106 of the N-type TFT 130 in the image display part 196, a gate electrode 136 of the N-type TFT 180 in the gate driver 194, a gate electrode 166 of the P-type TFT 190 in the gate driver 194, a gate line 102, and a storage electrode 150.

Next, n⁻ ions may be injected into the active layer 114 of the N-type TFT 130 in the image display part 196, the active layer 144 of the N-type TFT 180 in the gate driver 194, and the active layer 174 of the P-type TFT 190 in the gate driver 194, using the gate electrode 106 of the N-type TFT 130 in the image display part 196, the gate electrode 136 of the N-type TFT 180 in the gate driver 194 and the gate electrode 166 of the P-type TFT 190 in the gate driver 194 as a mask. Accordingly, the active layers 114, 144, and 174 may be converted into LDD areas 114L, 144L, and 174L, and channel areas 114C, 144C, and 174C.

Figure 11B:
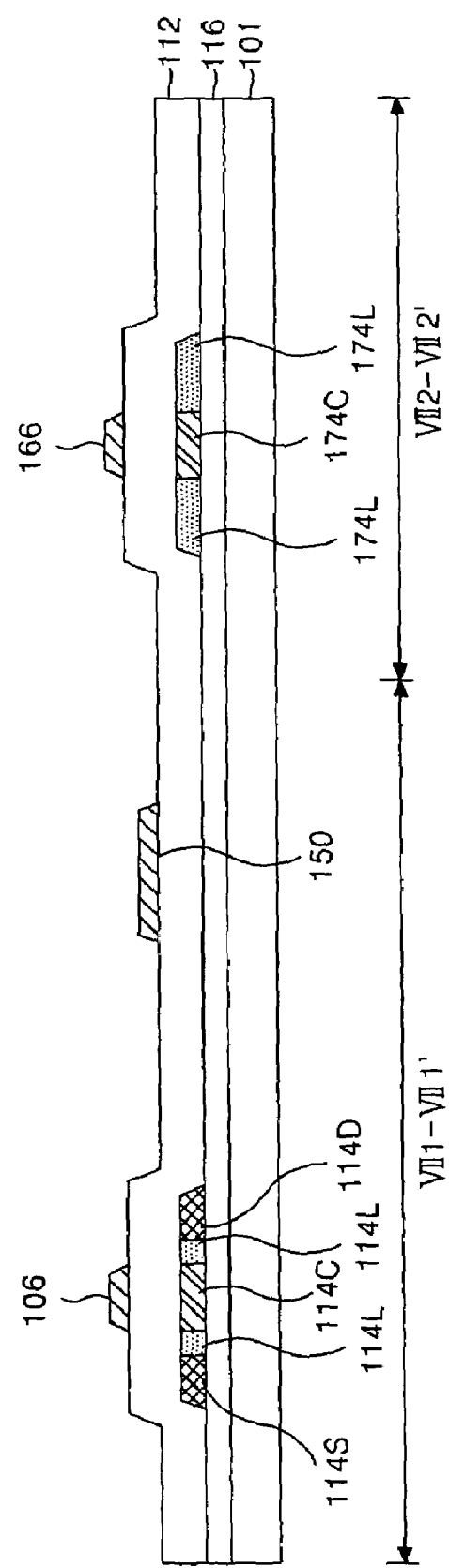
FIG. 11B is a cross sectional view along VII1–VII1' and VII2–VII2' of FIG. 11A according to the present invention.

FIG. 11A is a plan view of an exemplary third mask process of an LCD device according to the present invention, and FIG. 11B is a cross sectional view along VII1–VII1' and VII2–VII2' of FIG. 11A according to the present invention. In FIGS. 11A and 11B, at step S23, source areas 114S and 144S and drain areas 114D and 144D may be formed on the active layers 114 and 144 of the N-type TFTs 130 and 180, respectively.

For example, a photo-resist may be deposited on the lower substrate 101 having an active pattern of the N-type TFTs 130 and 180 and the P-type TFT 190 having the channel areas 114C, 144C, and 174C, and the LDD areas 114L, 144L, and 174L, respectively. Then, the photo-resist may be patterned by a photolithographic process using the third mask, thereby forming a photo-resist pattern. The photo-resist pattern may be formed so as to overlap a portion of the N-type active layers 114 and 144, and may be formed so as to entirely overlap the active layer 174 of the P-type TFT 190. Then, n⁺ ions may be injected into the active layers 114 and 144 of the N-type TFTs 130 and 180 by using the photo-resist pattern as a mask, thereby forming the source areas 114S and 144S, and the drain areas 114D and 144D of the active layers 114 and 144.

Figure 12B:
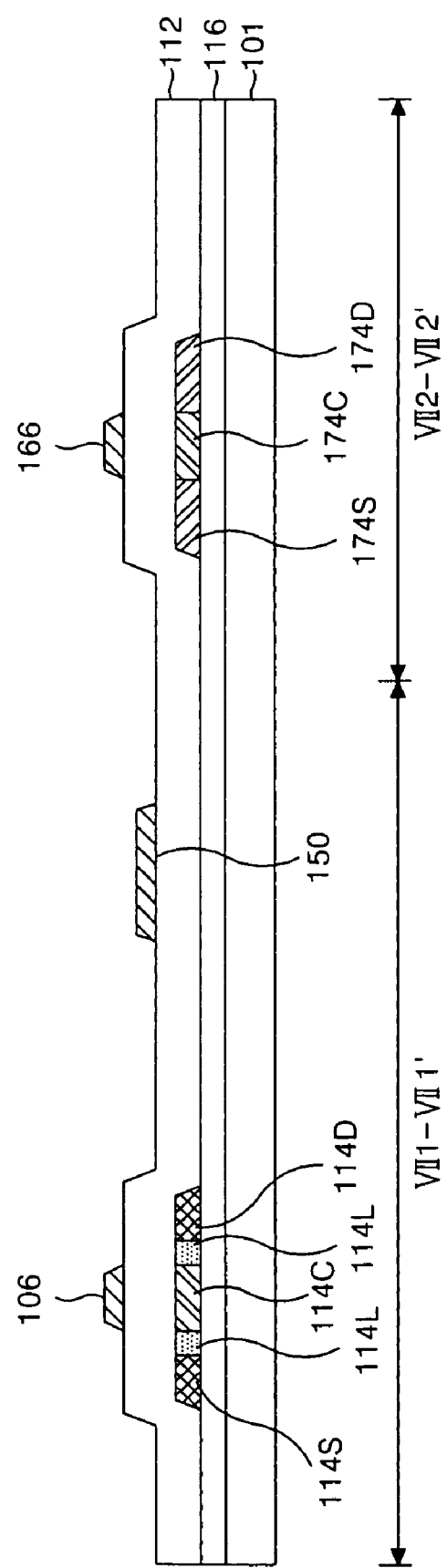
FIG. 12B is a cross sectional view along VII1–VII1' and VII2–VII2' of FIG. 12A according to the present invention.

FIG. 12A is a plan view of an exemplary fourth mask process of an LCD device according to the present invention, and FIG. 12B is a cross sectional view along VII1–VII1' and VII2–VII2' of FIG. 12A according to the present invention. In FIGS. 12A and 12B, at step S24, a source area 174S and a drain area 174D may be formed on the active layer 174 of the P-type TFT 190.

For example, a photo-resist may be deposited along an entire surface of the lower substrate 101 having the active layer to which the n⁺ ions are injected. Then, the photo-resist may be patterned by a photolithographic process using the fourth mask, thereby forming a photo-resist pattern. The photo-resist pattern may be formed so as to cover an area except for the active layer 174 of the P-type TFT 190. Then, p⁺ ions may be injected into the active layer 174 of the P-type TFT 190 by using the photo-resist pattern as a mask, so that the source area 174S and the drain area 174D of the active layer 174 of the P-type TFT 190 may be formed.

Figure 13A:
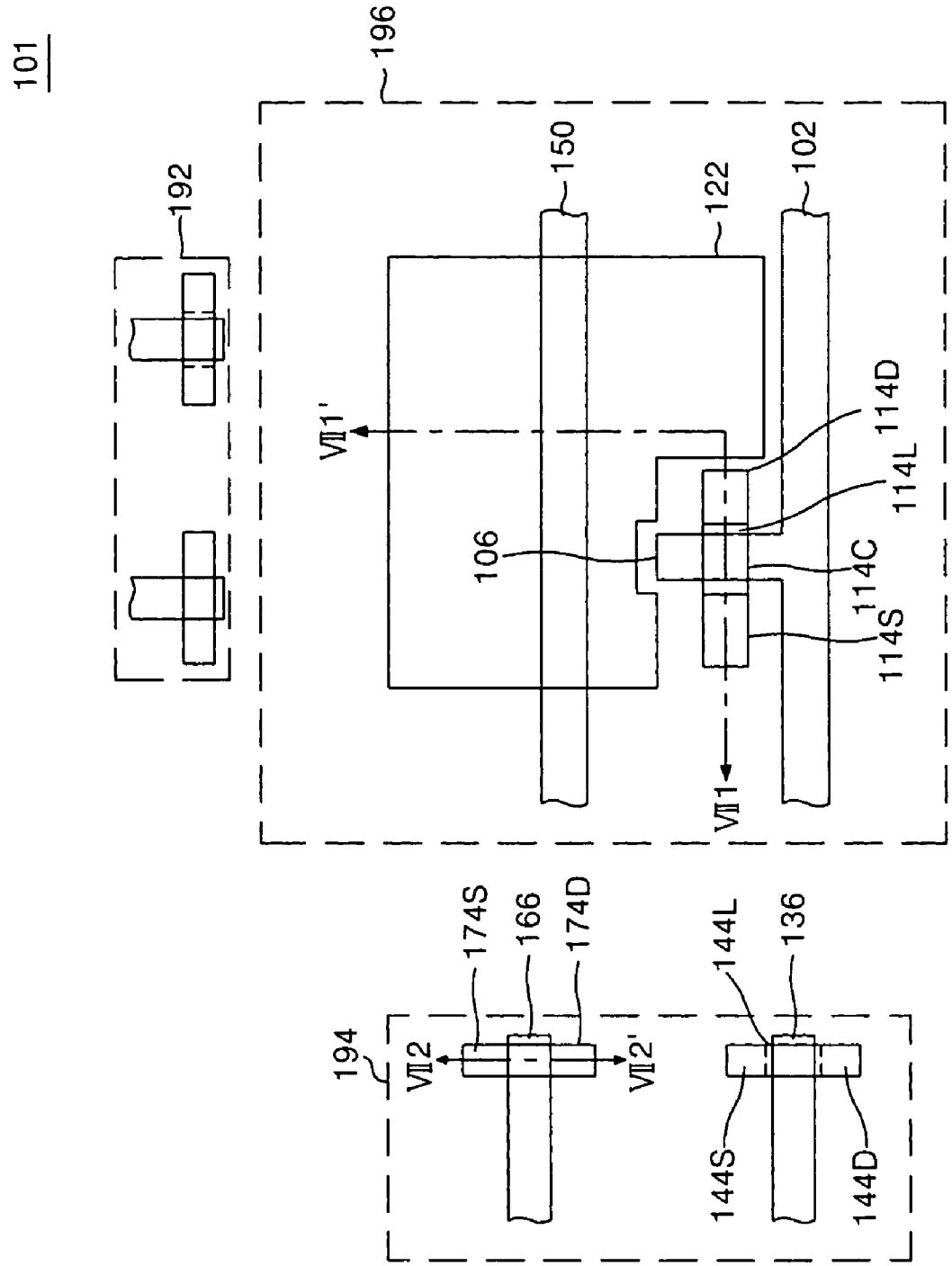
FIG. 13A is a plan view of an exemplary fifth mask process of an LCD device according to the present invention.

FIG. 13A is a plan view of an exemplary fifth mask process of an LCD device according to the present invention, and FIG. 13B is a cross sectional view along VII1–VII1' and VII2–VII2' of FIG. 13A according to the present invention. In FIGS. 13A and 13B, at step S25, a first interlayer insulating film 126 may be formed on the lower substrate 101 having the gate electrodes 106, 136, and 166. The first interlayer insulating film 126 may be made of an inorganic insulating material, such as silicon oxide $SiO_2$ and silicon nitride $SiN_x$. Then, a pixel electrode 122 to be connected to an N-type TFT 130 located in the image display part 196 may be formed on the first interlayer insulating film 126 using the fifth mask process.

For example, a transparent conductive material and a photo-resist may be sequentially deposited on the lower substrate 101 having the first interlayer insulating film 126 formed thereon by a depositing method, such as sputtering. The transparent conductive material may include one of indium-tin-oxide (ITO), tin-oxide (TO), and indium-zinc-oxide (IZO). Then, the photo-resist may be patterned by a photolithographic process using the fifth mask, thereby forming a photo-resist pattern. Next, the transparent conductive material may be patterned by an etching process using the photo-resist pattern as a mask, thereby forming a pixel electrode 122.

Figure 14A:
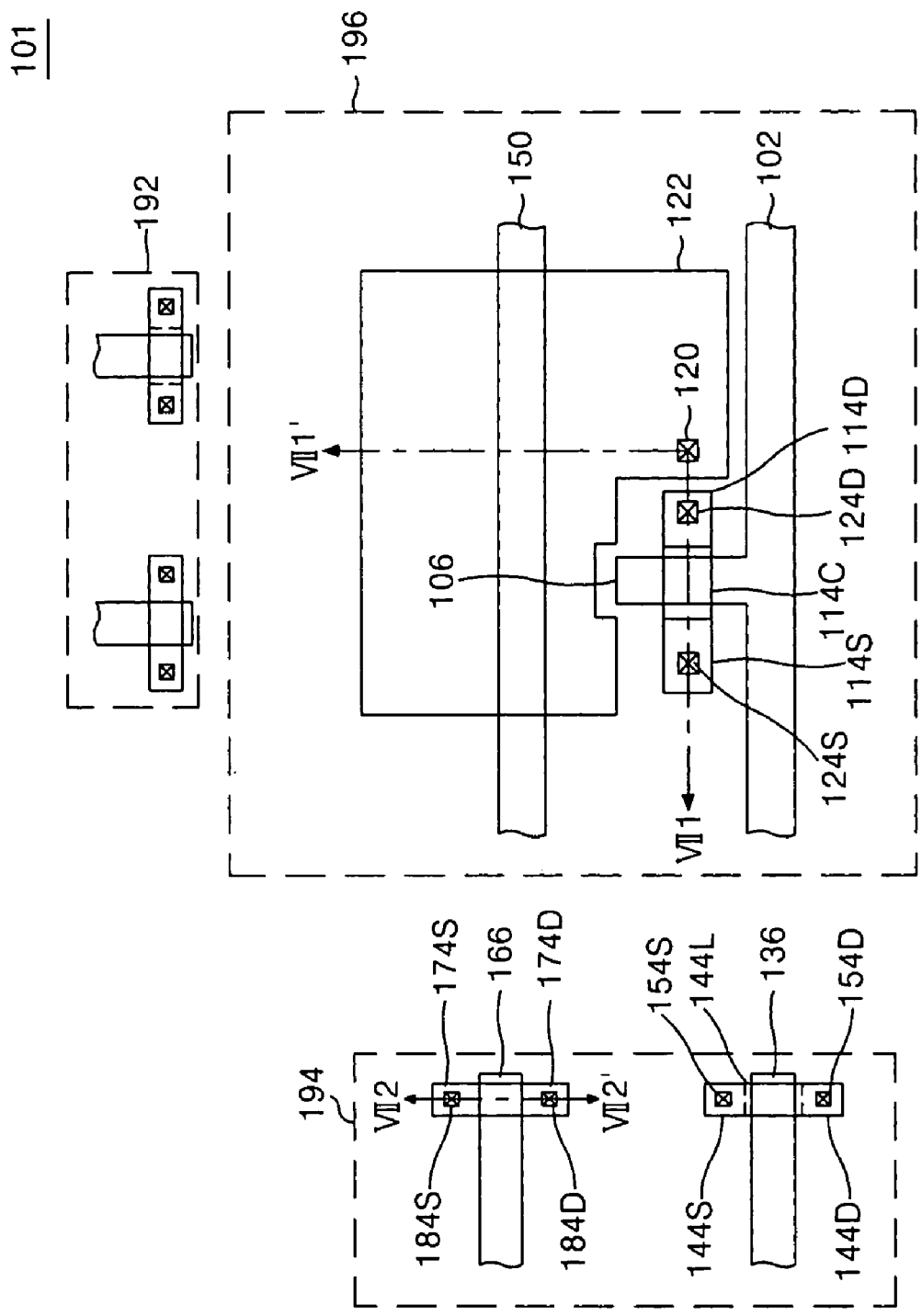
FIG. 14A is a plan view of an exemplary sixth mask process of an LCD device according to the present invention.
Figure 14B:
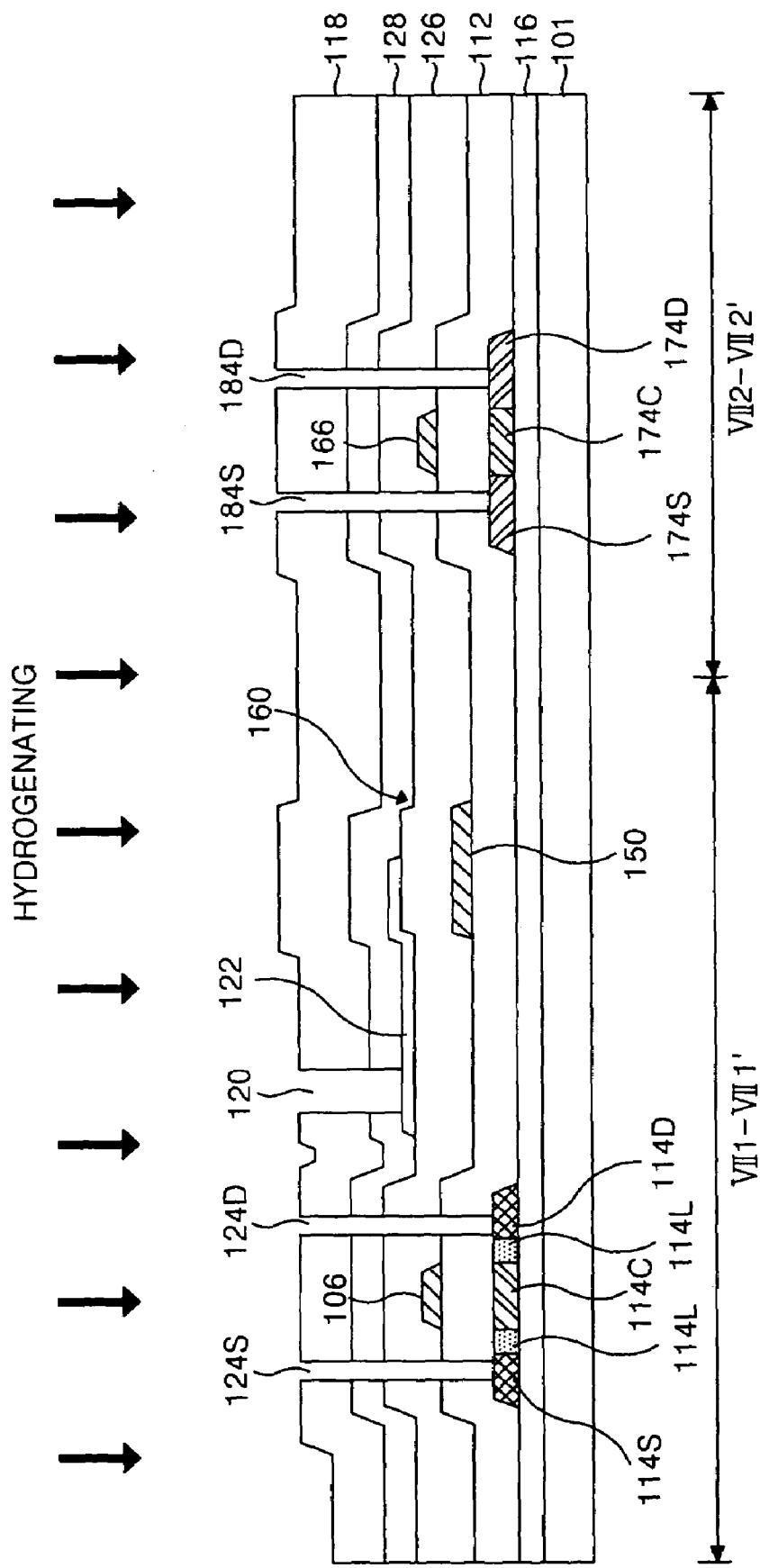
FIG. 14B is a cross sectional view along VII1–VII1' and VII2–VII2' of FIG. 14A according to the present invention.

FIG. 14A is a plan view of an exemplary sixth mask process of an LCD device according to the present invention, and FIG. 14B is a cross sectional view along VII1–VII1' and VII2–VII2' of FIG. 14A according to the present invention. In FIGS. 14A and 14B, at step S26, a first insulating material including silicon oxide $SiO_2$, and a second insulating material including silicon oxide $SiO_2$ and silicon nitride $SiN_x$, may be sequentially formed on the lower substrate 101 having the pixel electrode by a deposition method, such as PECVD and sputtering, thereby forming a second interlayer insulating film 128 and a passivation film 118. Accordingly, source contact holes 124S and 184S may be formed to expose the source areas 114S and 144S of the N-type TFTs 130 and 180 and the P-type TFT 190, drain contact holes 124D and 184D may be formed to expose the source areas 114D and 144D of the N-type TFTs 130 and 180 and the P-type TFT 190, and pixel contact holes 120 may be formed to expose the pixel electrode 122.

For example, a photo-resist may be deposited along an entire surface of the lower substrate 101 having the passivation film 118. Then, the photo-resist may be patterned by a photolithographic process using the sixth mask, thereby forming a photo-resist pattern. Next, the gate insulating film 112, the first and the second interlayer insulating films 126 and 128, and the passivation film 118 may be patterned by an etching process using the photo-resist pattern, thereby forming source contact holes 124S and 184S, and drain contact holes 124D and 184D exposing the active layers of the N-type TFTs 130 and 180 and the P-type TFT 190. In addition, the second interlayer insulating film 128 and the passivation film 118 may be patterned by an etching process using the photo-resist pattern as a mask, thereby forming a pixel contact hole 120 exposing the pixel electrode 122.

Accordingly, any one of the gate insulating film 122, the first interlayer insulating film 126, and the second interlayer insulating film 128 may be made of silicon oxide $SiO_2$, and may be etched by a wet-etching process using an etchant, such as buffereal oxide etchant (BOE) and hydrogen fluoride HF. In addition, any one of the gate insulating film 112 and the first interlayer insulating film 126, and the second interlayer insulating film 128 and the passivation film 118 may be made of silicon oxide $SiO_x$, and may be etched by a dry-etching process.

At step S27, the lower substrate 101 having the source contact holes 124S and 184S, and the drain contact holes 124D and 184D, and the pixel contact hole 120 may be placed inside a chamber, and subjected to a hydrogenating heat treatment process. For example, the hydrogenating heat treatment process may progress by using nitrogen $N_2$ and hydrogen $H_2$ gases at 360° C.~400° C. for about one hour.

Performing the hydrogenating heat treatment process may force dangling bonds, which do not bond with atoms included in a poly-silicon forming the active layers 114, 144, and 174, to be bonded with hydrogen $H_2$ included in the passivation film 118. Accordingly, it is possible to prevent a deterioration of TFT operational properties caused by the dangling bonds.

According to the present invention, a polycrystalline silicon type LCD device may include formation of source contact holes 124S and 184S, drain contact holes 124D and 184D, and pixel contact holes 120, and then a hydrogenating heat treatment process. Performing the hydrogenating heat treatment process after forming the passivation film 118 may prevents a destruction phenomenon or a loosening phenomenon of the pixel electrode 122.

Figure 15B:
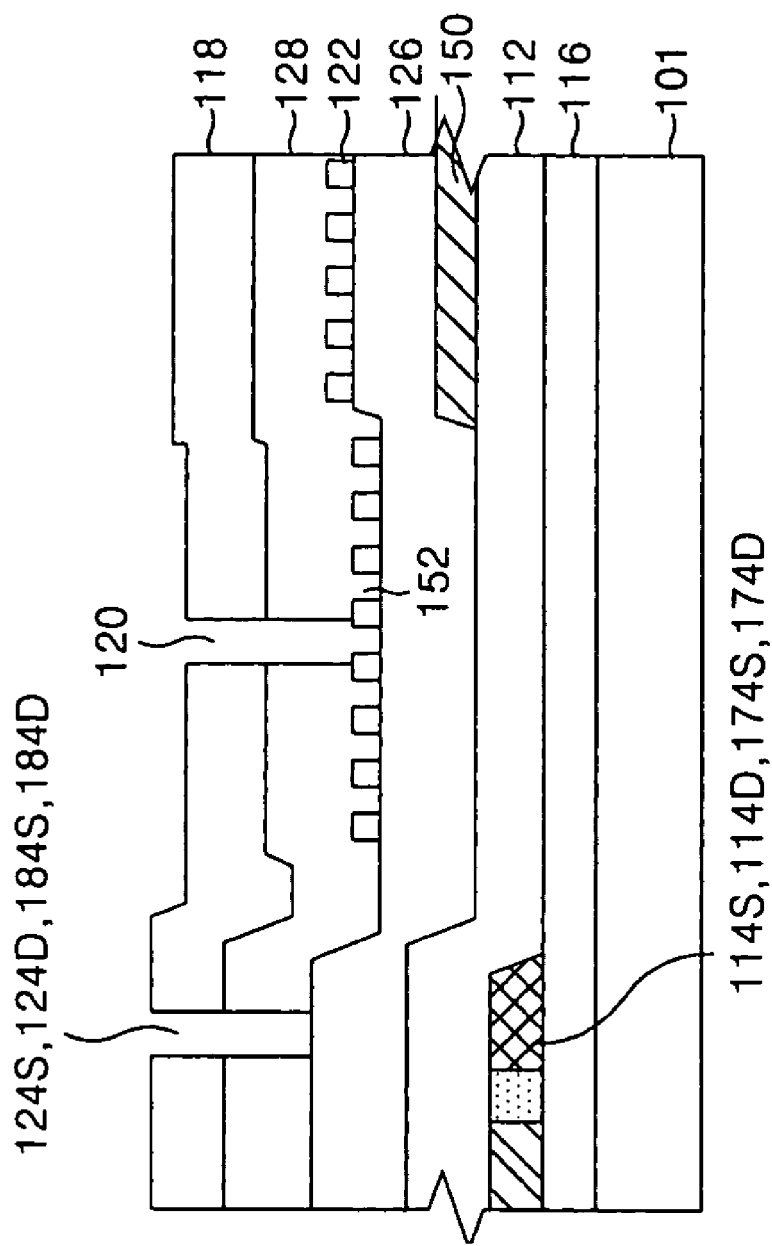
Figure 15C:
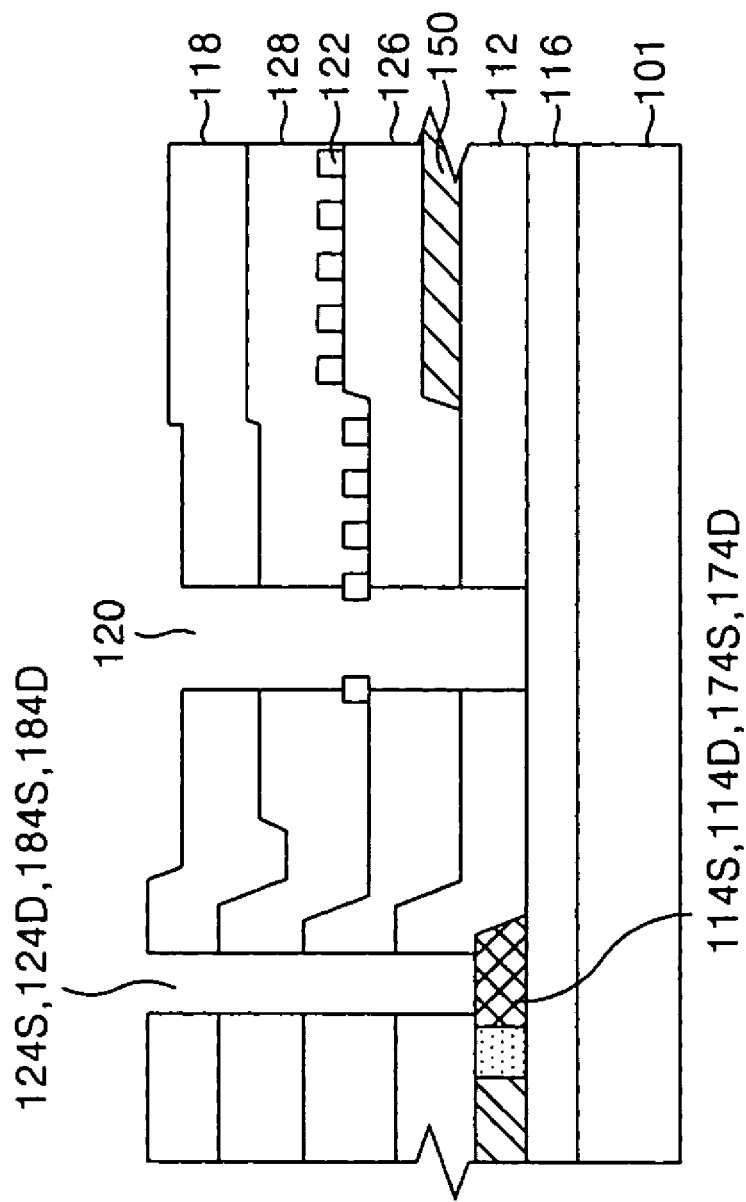

FIGS. 15A to 15C are cross sectional views of a hydrogenated heat treatment. In FIG. 15A, at least one layer insulating material may be deposited along an entire surface of the lower substrate having the pixel electrode 122, thereby forming the second interlayer insulating film 128 and the passivation film 118. Accordingly, if the hydrogenating process is performed after forming the passivation film 118, hydrogen $H_2$ used during the hydrogenating process reacts with the pixel electrode 122, thereby changing properties of the pixel electrode 122. For example, if the pixel electrode 122 reacts with the hydrogen $H_2$, then the pixel electrode 122 is converted into a porous film, as shown in FIG. 15B.

In FIG. 15B, the gate insulating film 112, the first interlayer insulating film 126, the second interlayer insulating film 128, and the passivation film 118 may be patterned by a photolithographic process and an etching process in order to form the drain holes 124D and 184D, and the pixel contact hole 120. For example, the passivation film 118 and the second interlayer insulating film 126 may be etched by an etching process, including a wet-etching using an etchant such as buffereal oxide etchant (BOE) and hydrogen fluoride HF, thereby forming the pixel contact hole 120 to expose the pixel electrode 122.

In FIG. 15C, the first interlayer insulating film 126 and the gate insulating film 112 may be etched by an etching process, including a wet-etching using an etchant such as buffereal oxide etchant (BOE) and hydrogen fluoride HF, thereby forming the source contact holes 124S and 184S and the drain contact holes 124D and 184D, respectively, to expose the source areas and the drain areas of the active layer. Accordingly, the etchant etching the first interlayer insulating film 126 and the gate insulating film 112 may pass through porous parts 152 (in FIG. 15B) of the pixel electrode 122 and react with the first interlayer insulating film 126 located in a lower portion of the pixel electrode 122, thereby patterning the first interlayer insulating film 126. As a result, the pixel electrode 122 may be destroyed. Specifically, if a pad electrode of a pad part simultaneously formed with a metal identical to the pixel electrode 122 is destroyed, then a driving signal cannot be supplied to the gate line 102 and the data line 104.

According to the present invention, in order to prevent the above problem, after forming the source contact holes 124S and 184S, and the drain contact holes 124D and 184D, and the pixel contact hole 120, the hydrogenating heat treatment process may be performed. For example, as shown in FIGS. 14A and 14B, the second interlayer insulating film 128 and the passivation film 118 may be formed on the lower substrate 101 having the pixel electrode 122. Then, the pixel contact hole 120, the source contact holes 124S and 184S and the drain contact holes 124D and the 184D, exposing the pixel electrode 122, the source areas and the drain areas on the active layer, respectively, may be formed. Next, the hydrogenating heat treatment process may be performed. Although the properties of the pixel electrode 122 may be changed by reacting with hydrogen $H_2$ used during the hydrogenating process, the destruction and the loosening phenomenon may be prevented since the exposed pixel electrode 122 may not etched.

Figure 16A:
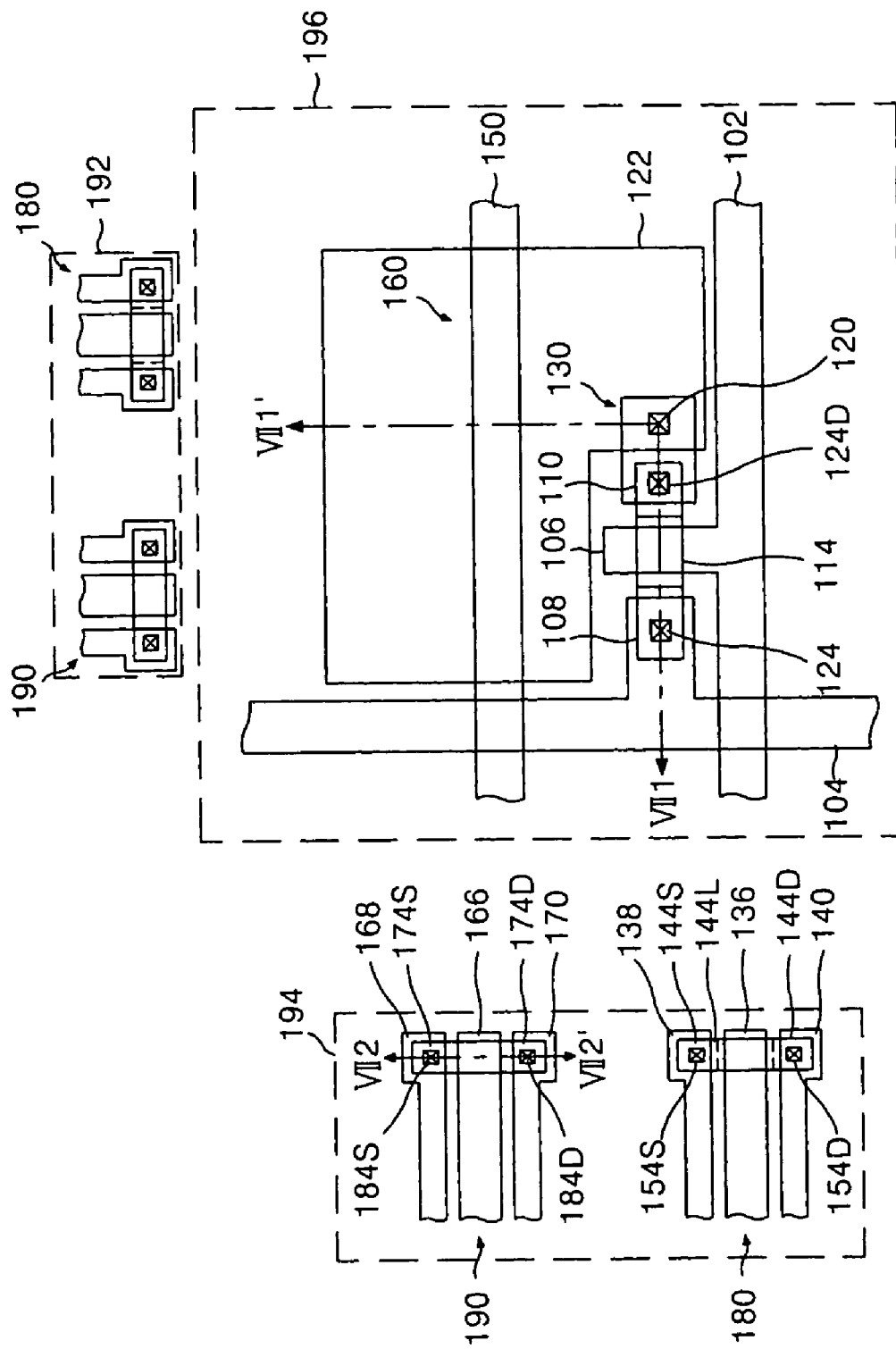
FIG. 16A is a plan view of an exemplary seventh mask process of an LCD device according to the present invention.
Figure 16B:
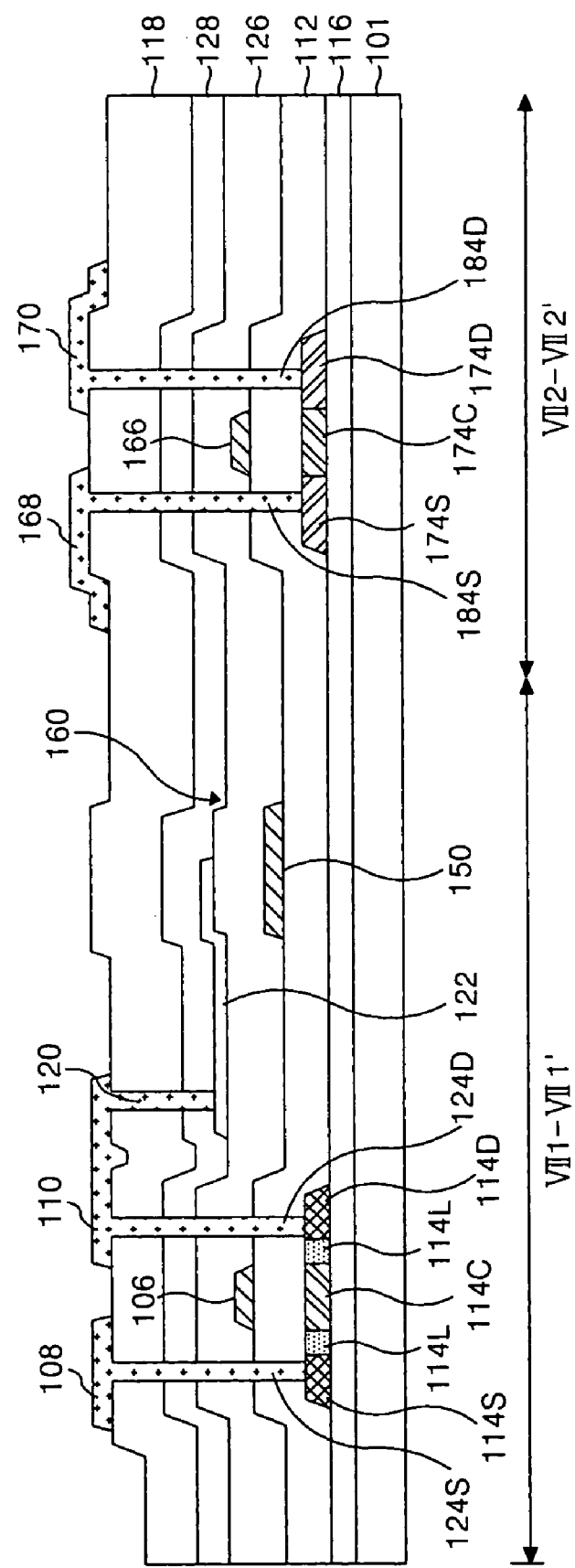
FIG. 16B is a cross sectional view along VII1–VII1' and VII2–VII2' of FIG. 16A according to the present invention.

FIG. 16A is a plan view of an exemplary seventh mask process of an LCD device according to the present invention, and FIG. 16B is a cross sectional view along VII1–VII1' and VII2–VII2' of FIG. 16A according to the present invention. In FIGS. 16A and 16B, at step S28, source electrodes 108, 138, and 168, and drain electrodes 110, 140, and 170 of the N-type TFTs 130 and 180 and the P-type TFT 190, respectively, are formed by the seventh mask process on the lower substrate having the passivation film 118.

For example, a data metal layer may be deposited by a deposition method, such as sputtering, on the lower substrate 101 having the source contact holes 124S, 154S, and 184S, and the drain contact holes 124D, 154D, and 184D. Then, a photo-resist may be deposited along an entire surface of the data metal layer and patterned by a photolithographic process using the seventh mask, thereby forming a photo-resist pattern. Then, the data metal layer may be patterned by an etching process using the photo-resist pattern as a mask, thereby forming source electrodes 108, 138, and 168, and drain electrodes 110, 140, and 170 of the N-type TFTs 130 and 180 and the P-type TFT 190, respectively.

The source electrodes 108 and 138, and the drain electrodes 110 and 140 of the N-type TFTs 130 and 180, respectively, may contact the source areas 114S and 144S, and the drain areas 114D and 144D at the active layer of the N-type TFTs 130 and 180 via the source contact holes 124S and 154S and the drain contact holes 124D and 154D, respectively. In addition, the drain electrode of the N-type TFT 130 may contact the pixel electrode via the pixel contact hole 120. Furthermore, the source electrode 168 and the drain electrode 170 of the P-type TFT 190 may contact the source area 174S and the drain area 174D at the active layer of the P-type TFT 190 via the source contact hole 184S and the drain contact hole 184D, respectively.

According to the present invention, a method of fabricating an LCD device may include forming contact holes and then performing a hydrogenating heat treatment process. Thus, it is possible to prevent destruction and a loosening phenomena of a pixel electrode having changed properties by the hydrogenating heat treatment process. Furthermore, according to the present invention a pixel electrode may be formed before forming a source electrode and a drain electrode. Thus, source contact holes, drain contact holes, and a pixel contact hole may be simultaneously formed. As a result, it is possible to reduce the number of individual mask processes.

It will be apparent to those skilled in the art that various modifications and variations can be made in the method of fabricating an LCD device of the present invention without departing from the spirit or scope of the invention. Thus, it is intended that the present invention cover the modifications and variations of this invention provided they come within the scope of the appended claims and their equivalents.

What is claimed is:

1. A method of fabricating a liquid crystal display device, comprising:

forming a first active layer on a substrate;

forming a first gate insulating film on the first active layer;

forming a first gate electrode on the first gate insulating film;

forming a first interlayer insulating layer on the first gate electrode;

forming a pixel electrode on the first interlayer insulating layer;

forming at least one insulating film to cover the pixel electrode;

forming a first plurality of contact holes in the first interlayer insulating layer and the at least one insulating film, the first plurality of contact holes including a first source contact hole to expose a first source area of the first active layer and a first drain contact hole to expose a first drain area of the first active layer;

forming a pixel contact hole in the at least one insulating film to expose the pixel electrode;

performing a hydrogenating treatment to the substrate including the first source contact hole and first source area, the first drain contact hole and the first drain area, and the pixel contact hole and the pixel electrode; and forming a first source electrode contacting the first source area of the first active layer, and a first drain electrode contacting the direct drain area of the first active layer and connected to the pixel electrode.

2. The method according to claim 1, wherein the step of forming the at least one insulating film includes:

forming a second interlayer insulating layer on the first interlayer insulating layer to cover the pixel electrode; and forming a passivation film on the second interlayer insulating layer.

3. The method of claim 2, wherein the step of forming the first source contact hole to expose the first source area of the first active layer, the first drain contact hole to expose the first drain area of the first active layer, and the pixel contact hole to expose the pixel electrode includes:

forming the first source contact hole and the first drain contact hole passing through the first gate insulating film, the first interlayer insulating layer, the second interlayer insulating layer and the passivation film; and forming the pixel contact hole passing through the second interlayer insulating layer and the passivation film.

4. The method according to claim 1, wherein the first gate insulating film, the first interlayer insulating layer, and the insulating film layer include etchant reactable silicon oxide $SiO_x$.

5. The method according to claim 4, wherein the first gate insulating film, the first interlayer insulating layer, and the insulating film are wet-etched by an etchant having one of buffereal oxide etchant BOB and hydrogen fluoride HF.

6. The method according to claim 1, wherein the first gate insulating film, the first interlayer insulating layer, and the insulating film include etching gas reactable silicon oxide $SiO_x$.

7. The method according to claim 1, further comprising:

forming a second active layer on the substrate;

forming a second gate electrode on the first gate insulating film over the second active layer;

forming a second plurality of contact holes in the first interlayer insulating layer and the at least one insulating film, the second plurality of contact holes including a second source contact hole to expose a second source area of the second active layer and a second drain contact hole to expose a second drain area of the second active layer;

forming a second source electrode and a second drain electrode on the at least one insulating film, the second source electrode connected to the second source area of the second active layer through the second source contact hole and the second drain electrode connected to the second drain area of the second active layer through the second drain contact hole, wherein the second plurality of contact holes are disposed within a driving circuit part of the liquid crystal display device for generating driving signals to drive liquid crystal cells disposed within an image display part of the liquid crystal display device.

8. The method according to claim 7, further comprising:

injecting a first impurity into the first active layer using the first gate electrode as a mask; and injecting a second impurity into the second active layer using the second gate electrode as a mask.

9. The method according to claim 7, wherein the forming the first and second pluralities of contact holes is performed simultaneously.

10. The method according to claim 1, further comprising forming a storage capacitor on the first gate insulating film, the storage capacitor including a storage electrode formed simultaneously with the first gate electrode and the pixel electrode formed to overlap the storage electrode with the first interlayer insulating layer therebetween.

11. A method of fabricating a liquid crystal display device, comprising:

forming a plurality of active layers on a substrate;

forming a gate insulating film on each of the plurality of active layers;

forming a plurality of gate electrodes on the gate insulating film, each of the plurality of gate electrodes corresponds with each of the plurality of active layers;

forming an interlayer insulating layer on the plurality of gate electrodes;

forming a pixel electrode on the interlayer insulating layer;

forming at least one insulating film to cover the pixel electrode;

forming a plurality of contact holes in the interlayer insulating layer and the at least one insulating film, each of the plurality of contact holes exposing portions of each of the plurality of active layers and the pixel electrode;

performing a hydrogenating treatment to the substrate including the plurality of contact holes and the exposed portions of each of the plurality of active layers and the pixel electrode;

forming a plurality of electrodes contacting each of the exposed portions of each of the plurality of active layers through the plurality of contact holes, wherein at least one of the plurality of electrodes electrically interconnects one of the exposed portions of the plurality of active layers with the pixel electrode.

* * * * *